(12) United States Patent
Yu et al.

(10) Patent No.: US 11,101,256 B2
(45) Date of Patent: Aug. 24, 2021

(54) OPTICAL MODULATORS

(71) Applicant: ROCKLEY PHOTONICS LIMITED, London (GB)

(72) Inventors: Guomin Yu, Glendora, CA (US); Amit Singh Nagra, Altadena, CA (US); Damiana Lerose, Pasadena, CA (US); Hooman Abediasl, Pasadena, CA (US); Pradeep Srinivasan, Fremont, CA (US); Joyce Kai See Poon, Toronto (CA); Zheng Yong, Toronto (CA); Haydn Frederick Jones, Reading (GB)

(73) Assignee: Rockley Photonics Limited, Oxford (GB)

( * ) Notice: Subject to any disclaimer, the term of this patent is extended or adjusted under 35 U.S.C. 154(b) by 0 days.

(21) Appl. No.: 16/195,774

(22) Filed: Nov. 19, 2018

(65) Prior Publication Data

US 2019/0139950 A1    May 9, 2019

Related U.S. Application Data

(63) Continuation-in-part of application No. 15/430,314, filed on Feb. 10, 2017, now Pat. No. 10,135,542, and
(Continued)

(30) Foreign Application Priority Data

Jul. 18, 2017   (GB) ...................... 1711525

(51) Int. Cl.
*H04B 10/54* (2013.01)
*G02F 1/017* (2006.01)
(Continued)

(52) U.S. Cl.
CPC ........ *H01L 25/167* (2013.01); *G02F 1/01708* (2013.01); *H04B 10/524* (2013.01);
(Continued)

(58) Field of Classification Search
None
See application file for complete search history.

(56) References Cited

U.S. PATENT DOCUMENTS

| | | |
|---|---|---|
| 4,093,345 A | 6/1978 | Logan et al. |
| 4,720,468 A | 1/1988 | Menigaux et al. |
| | (Continued) | |

FOREIGN PATENT DOCUMENTS

| | | |
|---|---|---|
| CN | 101529306 A | 9/2009 |
| CN | 101868745 A | 10/2010 |
| | (Continued) | |

OTHER PUBLICATIONS

Dube-Demers et al., Low-power DAC-less PAM4 transmitter using a cascaded microring modulator, Nov. 15, 2016, Optical Society of America, pp. 5369-5372 (Year: 2016).*
(Continued)

*Primary Examiner* — Jai M Lee
(74) *Attorney, Agent, or Firm* — Lewis Roca Rothgerber Christie LLP

(57) ABSTRACT

An optoelectronic device. The optoelectronic device operable to provide a PAM-N modulated output, the device comprising: M optical modulators, M being an integer greater than 1, the M optical modulators being arranged in a cascade, the device being configured to operate in N distinct transmittance states, as a PAM-N modulator, wherein, in each transmittance state of the N distinct transmittance states, each of the M optical modulators has applied to it a respective control voltage equal to one of: a first voltage or a second voltage. One or more of the modulators may include a substrate; a crystalline cladding layer, on top of the substrate; and an optically active region, above the crystalline cladding layer. The crystalline cladding layer
(Continued)

may have a refractive index which is less than a refractive index of the optically active region.

24 Claims, 19 Drawing Sheets

Related U.S. Application Data a continuation-in-part of application No. 15/700,053, filed on Sep. 8, 2017, now Pat. No. 10,133,094, and a continuation-in-part of application No. 15/700,055, filed on Sep. 8, 2017, now Pat. No. 10,185,203, and a continuation-in-part of application No. PCT/EP2017/080216, filed on Nov. 23, 2017, which is a continuation-in-part of application No. 15/700,053, filed on Sep. 8, 2017, now Pat. No. 10,133,094, and a continuation-in-part of application No. 15/700,055, filed on Sep. 8, 2017, now Pat. No. 10,185,203, application No. 16/195,774, filed on Nov. 19, 2018, which is a continuation-in-part of application No. PCT/EP2018/062269, filed on May 11, 2018, which is a continuation-in-part of application No. PCT/EP2017/080221, filed on Nov. 23, 2017.

(60) Provisional application No. 62/435,004, filed on Dec. 15, 2016, provisional application No. 62/528,900, filed on Jul. 5, 2017, provisional application No. 62/426,117, filed on Nov. 23, 2016, provisional application No. 62/427,132, filed on Nov. 28, 2016.

(51) Int. Cl.
*H01L 25/16* (2006.01)
*H04B 10/524* (2013.01)
*G02F 1/015* (2006.01)
*H04B 10/50* (2013.01)

(52) U.S. Cl.
CPC .......... *H04B 10/54* (2013.01); *G02F 1/0155* (2021.01); *H04B 10/501* (2013.01)

(56) References Cited

U.S. PATENT DOCUMENTS

| | | | |
|---|---|---|---|
| 4,739,287 A | 4/1988 | Staupendahl et al. |
| 4,943,133 A | 7/1990 | Deri et al. |
| 5,438,444 A | 8/1995 | Tayonaka et al. |
| 5,446,751 A | 8/1995 | Wake |
| 5,511,088 A | 4/1996 | Loualiche et al. |
| 5,524,076 A | 6/1996 | Rolland et al. |
| 5,559,624 A | 9/1996 | Darcie et al. |
| 5,581,396 A | 12/1996 | Kubota et al. |
| 5,715,076 A | 2/1998 | Alexander et al. |
| 5,726,784 A | 3/1998 | Alexander et al. |
| 5,757,986 A | 5/1998 | Crampton et al. |
| 5,784,184 A | 7/1998 | Alexander et al. |
| 5,861,966 A | 1/1999 | Ortel |
| 5,908,305 A | 6/1999 | Crampton et al. |
| 5,917,642 A * | 6/1999 | O'Donnell .............. G02F 1/225 359/245 |
| 5,999,300 A | 12/1999 | Davies et al. |
| 6,229,189 B1 | 5/2001 | Yap et al. |
| 6,233,077 B1 | 5/2001 | Alexander et al. |
| 6,298,177 B1 | 10/2001 | House |
| 6,349,106 B1 | 2/2002 | Coldren |
| 6,396,801 B1 | 5/2002 | Upton et al. |
| 6,445,839 B1 | 9/2002 | Miller |
| 6,549,313 B1 | 4/2003 | Doerr et al. |
| 6,563,627 B2 | 5/2003 | Yoo |
| 6,580,739 B1 | 6/2003 | Coldren |
| 6,584,239 B1 | 6/2003 | Dawnay et al. |
| 6,597,824 B2 | 7/2003 | Newberg et al. |
| 6,614,819 B1 | 9/2003 | Fish et al. |
| 6,636,662 B1 | 10/2003 | Thompson et al. |
| 6,678,479 B1 | 1/2004 | Naoe et al. |
| 6,680,791 B2 | 1/2004 | Demir et al. |
| 6,710,911 B2 | 3/2004 | LoCascio et al. |
| 6,768,827 B2 | 7/2004 | Yoo |
| 6,845,198 B2 | 1/2005 | Montgomery et al. |
| 6,873,763 B2 | 3/2005 | Nikonov |
| 7,031,617 B2 | 4/2006 | Zucchelli et al. |
| 7,085,443 B1 | 8/2006 | Gunn, III et al. |
| 7,092,609 B2 | 8/2006 | Yegnanarayanan et al. |
| 7,133,576 B2 | 11/2006 | Coldren et al. |
| 7,174,058 B2 | 2/2007 | Coldren et al. |
| 7,180,148 B2 | 2/2007 | Morse |
| 7,184,438 B2 | 2/2007 | Loge et al. |
| 7,256,929 B1 | 8/2007 | Rong et al. |
| 7,394,948 B1 | 7/2008 | Zheng et al. |
| 7,418,166 B1 | 8/2008 | Kapur et al. |
| 7,505,686 B2 | 3/2009 | Jennen |
| 7,536,067 B2 | 5/2009 | Handelman |
| 7,558,487 B2 | 7/2009 | Liu et al. |
| 7,570,844 B2 | 8/2009 | Handelman |
| 7,603,016 B1 | 10/2009 | Soref |
| 7,747,122 B2 * | 6/2010 | Shetrit .................. G02F 1/2257 385/130 |
| 7,811,844 B2 | 10/2010 | Carothers et al. |
| 7,826,700 B2 | 11/2010 | Knights et al. |
| 7,885,492 B2 | 2/2011 | Welch et al. |
| 7,916,377 B2 | 3/2011 | Witzens et al. |
| 7,920,790 B2 | 4/2011 | Toliver |
| 7,941,014 B1 | 5/2011 | Watts et al. |
| 8,053,790 B2 | 11/2011 | Feng et al. |
| 8,073,029 B2 | 12/2011 | Hashimoto |
| 8,093,080 B2 | 1/2012 | Liao et al. |
| 8,160,404 B2 * | 4/2012 | Pan .......................... G02F 1/025 385/2 |
| 8,242,432 B2 | 8/2012 | Feng et al. |
| 8,346,028 B2 | 1/2013 | Feng et al. |
| 8,362,494 B2 | 1/2013 | Lo et al. |
| 8,401,385 B2 | 3/2013 | Spivey et al. |
| 8,403,571 B2 | 3/2013 | Walker |
| 8,410,566 B2 | 4/2013 | Qian et al. |
| 8,493,976 B2 | 7/2013 | Lin |
| 8,693,811 B2 * | 4/2014 | Morini .................... G02F 1/025 385/3 |
| 8,724,988 B2 | 5/2014 | Andriolli et al. |
| 8,737,772 B2 | 5/2014 | Dong et al. |
| 8,774,625 B2 | 7/2014 | Binkert et al. |
| 8,792,787 B1 | 7/2014 | Zhao et al. |
| 8,809,906 B2 | 8/2014 | Zhu et al. |
| 8,817,354 B2 | 8/2014 | Feng et al. |
| 8,942,559 B2 | 1/2015 | Binkert et al. |
| 9,110,348 B2 | 8/2015 | Goi et al. |
| 9,128,309 B1 * | 9/2015 | Robertson .............. G02F 1/035 |
| 9,142,698 B1 | 9/2015 | Cunningham et al. |
| 9,182,546 B2 | 11/2015 | Prosyk et al. |
| 9,229,249 B2 | 1/2016 | Akiyama |
| 9,279,936 B2 | 3/2016 | Qian et al. |
| 9,282,384 B1 | 3/2016 | Graves |
| 9,306,698 B2 | 4/2016 | Chen et al. |
| 9,329,415 B2 | 5/2016 | Song et al. |
| 9,411,177 B2 | 8/2016 | Cunningham et al. |
| 9,438,970 B2 | 9/2016 | Jones et al. |
| 9,448,425 B2 | 9/2016 | Ogawa et al. |
| 9,513,498 B2 | 12/2016 | Jones et al. |
| 9,541,775 B2 | 1/2017 | Ayazi et al. |
| 9,548,811 B2 | 1/2017 | Kucharski et al. |
| 9,575,337 B2 * | 2/2017 | Adams .................... G02F 1/025 |
| 9,668,037 B2 | 5/2017 | Jones et al. |
| 9,733,542 B2 * | 8/2017 | Bai ......................... G02F 1/225 |
| 10,128,957 B2 * | 11/2018 | Welch ................. H04B 10/5055 |
| 10,133,094 B1 | 11/2018 | Yu et al. |
| 10,185,203 B1 | 1/2019 | Yu et al. |
| 10,191,350 B2 | 1/2019 | Yu et al. |
| 10,216,059 B2 * | 2/2019 | Yu ......................... G02F 1/2257 |
| 10,222,677 B2 | 3/2019 | Yu et al. |
| 10,231,038 B2 | 3/2019 | Rickman et al. |
| 10,401,656 B2 | 9/2019 | Yu et al. |
| 2001/0030787 A1 | 10/2001 | Tajima |

(56) References Cited

U.S. PATENT DOCUMENTS

| | | |
|---|---|---|
| 2001/0040907 A1 | 11/2001 | Chakrabarti |
| 2002/0048289 A1 | 4/2002 | Atanackovic et al. |
| 2002/0102046 A1 | 8/2002 | Newberg et al. |
| 2002/0154847 A1 | 10/2002 | Dutt et al. |
| 2002/0159117 A1 | 10/2002 | Nakajima et al. |
| 2002/0186453 A1 | 12/2002 | Yoo |
| 2003/0031445 A1 | 2/2003 | Parhami et al. |
| 2003/0063362 A1 | 4/2003 | Demir et al. |
| 2003/0095737 A1 | 5/2003 | Welch et al. |
| 2003/0133641 A1 | 7/2003 | Yoo |
| 2003/0142943 A1 | 7/2003 | Yegnanarayanan et al. |
| 2003/0156789 A1 | 8/2003 | Bhardwaj et al. |
| 2003/0176075 A1 | 9/2003 | Khan et al. |
| 2003/0223672 A1 | 12/2003 | Joyner et al. |
| 2004/0008395 A1 | 1/2004 | McBrien et al. |
| 2004/0013429 A1 | 1/2004 | Duelk et al. |
| 2004/0033004 A1 | 2/2004 | Welch et al. |
| 2004/0126057 A1 | 7/2004 | Yoo |
| 2004/0207016 A1 | 10/2004 | Patel et al. |
| 2004/0208454 A1* | 10/2004 | Montgomery .......... G02F 1/025 385/50 |
| 2004/0246557 A1 | 12/2004 | Lefevre et al. |
| 2005/0053377 A1 | 3/2005 | Yoo |
| 2005/0089269 A1 | 4/2005 | Cheng et al. |
| 2005/0089273 A1 | 4/2005 | Squires et al. |
| 2005/0286850 A1* | 12/2005 | German ................ G02B 6/105 385/129 |
| 2006/0140528 A1 | 6/2006 | Coldren et al. |
| 2006/0257065 A1 | 11/2006 | Coldren et al. |
| 2007/0065076 A1 | 3/2007 | Grek et al. |
| 2007/0104441 A1 | 5/2007 | Ahn et al. |
| 2007/0116398 A1* | 5/2007 | Pan ................... H01L 31/1055 385/2 |
| 2007/0280309 A1 | 12/2007 | Liu |
| 2008/0013881 A1 | 1/2008 | Welch et al. |
| 2008/0095486 A1* | 4/2008 | Shastri ............... G02F 1/0123 385/3 |
| 2008/0138088 A1 | 6/2008 | Welch et al. |
| 2009/0003841 A1 | 1/2009 | Ghidini et al. |
| 2009/0169149 A1 | 7/2009 | Block |
| 2009/0185804 A1 | 7/2009 | Kai et al. |
| 2009/0245298 A1 | 10/2009 | Sysak et al. |
| 2010/0002994 A1* | 1/2010 | Baehr-Jones ....... G02B 6/1223 385/32 |
| 2010/0060970 A1 | 3/2010 | Chen |
| 2010/0060972 A1* | 3/2010 | Kucharski ............ H04B 10/541 359/290 |
| 2010/0078680 A1 | 4/2010 | Cheng et al. |
| 2010/0080504 A1 | 4/2010 | Shetrit et al. |
| 2010/0128336 A1 | 5/2010 | Witzens et al. |
| 2010/0135347 A1 | 6/2010 | Deladurantaye et al. |
| 2010/0200733 A1 | 8/2010 | McLaren et al. |
| 2010/0290732 A1 | 11/2010 | Gill |
| 2010/0296768 A1 | 11/2010 | Wu et al. |
| 2010/0310208 A1 | 12/2010 | Wang et al. |
| 2010/0330727 A1* | 12/2010 | Hill .................... G02F 1/025 438/69 |
| 2011/0013905 A1 | 1/2011 | Wang et al. |
| 2011/0013911 A1 | 1/2011 | Alexander et al. |
| 2011/0142390 A1 | 6/2011 | Feng et al. |
| 2011/0142391 A1 | 6/2011 | Asghari et al. |
| 2011/0158582 A1 | 6/2011 | Su et al. |
| 2011/0170819 A1 | 7/2011 | Zheng et al. |
| 2011/0180795 A1 | 7/2011 | Lo et al. |
| 2011/0200333 A1 | 8/2011 | Schrenk et al. |
| 2011/0293279 A1 | 12/2011 | Lam et al. |
| 2012/0080672 A1 | 4/2012 | Rong et al. |
| 2012/0093519 A1 | 4/2012 | Lipson et al. |
| 2012/0189239 A1* | 7/2012 | Tu ..................... G02F 1/025 385/2 |
| 2012/0207424 A1* | 8/2012 | Zheng ................ G02B 6/1228 385/2 |
| 2012/0213531 A1 | 8/2012 | Nazarathy et al. |
| 2012/0328292 A1 | 12/2012 | Testa et al. |
| 2013/0020556 A1 | 1/2013 | Bowers |
| 2013/0051727 A1* | 2/2013 | Mizrahi ............... G02B 6/122 385/28 |
| 2013/0051798 A1 | 2/2013 | Chen et al. |
| 2013/0058606 A1 | 3/2013 | Thomson et al. |
| 2013/0089340 A1 | 4/2013 | Huang et al. |
| 2013/0094797 A1 | 4/2013 | Zheng et al. |
| 2013/0182305 A1 | 7/2013 | Feng et al. |
| 2013/0188902 A1 | 7/2013 | Gardes et al. |
| 2013/0259483 A1 | 10/2013 | McLaren et al. |
| 2013/0315599 A1 | 11/2013 | Lam et al. |
| 2014/0161457 A1 | 6/2014 | Ho et al. |
| 2014/0226976 A1 | 8/2014 | Britz et al. |
| 2014/0307300 A1* | 10/2014 | Yang ..................... G02F 1/025 359/245 |
| 2014/0341498 A1 | 11/2014 | Manouvrier |
| 2014/0341499 A1 | 11/2014 | Manouvrier |
| 2014/0355925 A1 | 12/2014 | Manouvrier |
| 2015/0010307 A1 | 1/2015 | Zhong et al. |
| 2015/0071651 A1* | 3/2015 | Asmanis ............... H04B 10/524 398/141 |
| 2015/0162182 A1 | 6/2015 | Edmonds et al. |
| 2015/0277041 A1 | 10/2015 | Nakagawa et al. |
| 2015/0277157 A1 | 10/2015 | Jones et al. |
| 2015/0293384 A1* | 10/2015 | Ogawa .................... G02F 1/015 385/2 |
| 2015/0346520 A1* | 12/2015 | Lee ......................... G02F 1/011 385/2 |
| 2015/0373433 A1 | 12/2015 | McLaren et al. |
| 2016/0080844 A1 | 3/2016 | Jones et al. |
| 2016/0103382 A1 | 4/2016 | Liboiron-Ladouceur et al. |
| 2016/0211921 A1 | 7/2016 | Welch et al. |
| 2016/0218811 A1* | 7/2016 | Chen ................... H04B 10/5561 |
| 2016/0358954 A1 | 12/2016 | Hoyos et al. |
| 2016/0365929 A1* | 12/2016 | Nakamura ........... G02F 1/0121 |
| 2017/0082876 A1 | 3/2017 | Jones et al. |
| 2017/0155452 A1 | 6/2017 | Nagra et al. |
| 2017/0250758 A1 | 8/2017 | Kikuchi |
| 2017/0288781 A1* | 10/2017 | Carpentier ........... H04B 10/505 |
| 2018/0046057 A1 | 2/2018 | Yu et al. |
| 2018/0101082 A1* | 4/2018 | Yu .......................... G02F 1/025 |
| 2018/0217469 A1 | 8/2018 | Yu et al. |
| 2018/0267238 A1 | 9/2018 | Wang et al. |
| 2018/0335569 A1* | 11/2018 | Saito ....................... G02F 1/025 |
| 2018/0335653 A1 | 11/2018 | Mentovich et al. |
| 2019/0011799 A1* | 1/2019 | Yu .......................... G02F 1/0102 |
| 2019/0146304 A1 | 5/2019 | Yu et al. |

FOREIGN PATENT DOCUMENTS

| | | |
|---|---|---|
| CN | 101937135 A | 1/2011 |
| CN | 102162137 A | 8/2011 |
| CN | 102713703 A | 10/2012 |
| CN | 102955265 A | 3/2013 |
| CN | 103137777 A | 6/2013 |
| CN | 103907049 A | 7/2014 |
| CN | 104885003 A | 9/2015 |
| CN | 105445854 A | 3/2016 |
| EP | 0 310 058 A2 | 4/1989 |
| EP | 1 761 103 A1 | 3/2007 |
| EP | 3 046 275 A1 | 7/2016 |
| JP | 06-232384 A | 8/1994 |
| JP | 2004-163753 A | 6/2004 |
| JP | 2005-300678 A | 10/2005 |
| WO | WO 91/13375 A1 | 9/1991 |
| WO | WO 92/10782 A1 | 6/1992 |
| WO | WO 02/41663 A2 | 5/2002 |
| WO | WO 02/086575 A1 | 10/2002 |
| WO | WO 2008/024458 A2 | 2/2008 |
| WO | WO 2009/048773 A1 | 4/2009 |
| WO | WO 2011/069225 A1 | 6/2011 |
| WO | WO 2015/060820 A1 | 4/2015 |
| WO | WO 2016/094808 A1 | 6/2016 |
| WO | WO 2016/139484 A1 | 9/2016 |
| WO | WO 2016/154764 A2 | 10/2016 |
| WO | WO 2017/135436 A1 | 8/2017 |

(56) References Cited

FOREIGN PATENT DOCUMENTS

| WO | WO 2017/151055 A1 | 9/2017 |
|---|---|---|
| WO | WO 2018/096035 A1 | 5/2018 |

OTHER PUBLICATIONS

Wikipedia, Silicon dioxide, 2013 (Year: 2013).*
Kimoto et al., Metastable ultrathin crystal in thermally grown SiO2 film on Si substrate, 2012, AIP Publishing (Year: 2012).*
RP Photonics Encyclopedia, Refractive Index, 2015 (Year: 2015).*
RefractiveIndex.INFO, Refractive index database, https://RefractiveIndex.INFO (Year: 2015).*
Wikipedia, Silicon on insulator (Year: 2015).*
Wikipedia, Epitaxy, 2015 (Year: 2015).*
Pogossian et al., Analysis of high-confinement SiGe/Si waveguides for silicon-based optoelectronics, 1999, Optical Society of America (Year: 1999).*
Wikipedia, Cladding (fiber optics), 2012 (Year: 2012).*
Coldren et al., Diode Lasers and Photonic Integrated Circuits, 2012, John Wiley & Sons, Inc., Second edition (Year: 2012).*
U.K. Intellectual Property Office Examination Report, dated Apr. 12, 2019, for Patent Application No. GB1703716.9, 5 pages.
Chinese Notification of the First Office Action and Search Report, for Patent Application No. 201580009961.1, dated Sep. 5, 2018, 8 pages.
Partial English translation of the Chinese Notification of the First Office Action and Search Report, for Patent Application No. 201580009961.1, dated Sep. 5, 2018, 12 pages.
International Search Report and Written Opinion of the International Searching Authority, dated Mar. 8, 2018, Corresponding to PCT/EP2017/080221, 13 pages.
International Search Report and Written Opinion of the International Searching Authority, dated Aug. 29, 2018, Corresponding to PCT/EP2018/062269, 15 pages.
"40Gb/s 2R Optical Regenerator (wavelength converter)", CIP Technologies, Preliminary Datasheet, Nov. 2013, 2 pages.
Bregni, Stefano et al., "Architectures and Performance of AWG-Based Optical Switching Nodes for IP Networks", IEEE Journal on Selected Areas in Communications, Sep. 2003, pp. 1113-1121, vol. 21, No. 7.
Dong, Po et al., "High-speed low-voltage single-drive push-pull silicon Mach-Zehnder modulators", Optics Express, Mar. 12, 2012, pp. 6163-6169, vol. 20, No. 6.
Dong, Po et al., "Wavelength-tunable silicon microring modulator", Optics Express, May 10, 2010, pp. 10941-10946, vol. 18, No. 11.
Dubé-Demers, Raphaël et al., "Low-power DAC-less PAM-4 transmitter using a cascaded microring modulator", Optics Letters, Nov. 15, 2016, pp. 5369-5372, vol. 41, No. 22, Optical Society of America.
Durhuus, Terji et al., "All-Optical Wavelength Conversion by Semiconductor Optical Amplifiers", Journal of Lightwave Technology, Jun. 1996, pp. 942-954, vol. 14, No. 6.
Edagawa, Noboru et al., "Novel Wavelength Converter Using an Electroabsorption Modulator", IEICE Trans. Electron., Aug. 1998, pp. 1251-1257, vol. E81-C, No. 8.
Ellis, A.D. et al., "Error free 100Gbit/s wavelength conversion using grating assisted cross-gain modulation in 2mm long semiconductor amplifier", Electronics Letters, Oct. 1, 1998, pp. 1958-1959, vol. 34, No. 20.
Feng, Dazeng et al., "High-Speed GeSi Electroabsorption Modulator on the SOI Waveguide Platform", IEEE Journal of Selected Topics in Quantum Electronics, Nov./Dec. 2013, 10 pages, vol. 19, No. 6.
Fidaner, Onur et al., "Integrated photonic switches for nanosecond packet-switched optical wavelength conversion", Optics Express, Jan. 9, 2006, pp. 361-368, vol. 14, No. 1.
Fidaner, Onur et al., "Waveguide Electroabsorption Modulator on Si Employing Ge/SiGe Quantum Wells", Optical Society of America, 2007, 1 page.

Foster, Mark A., "Broad-band continuous-wave parametric wavelength conversion in silicon nanowaveguides", Optics Express, Sep. 24, 2007, pp. 12949-12958, vol. 15, No. 20.
Fu, Enjin et al., "Traveling Wave Electrode Design for Ultra Compact Carrier-injection HBT-based Electroabsorption Modulator in a 130nm BiCMOS Process", Proc. of SPIE, 2014, 11 pages, vol. 8989.
Geis, M.W. et al., "Silicon waveguide infrared photodiodes with >35 GHz bandwidth and phototransistors with 50 AW-1 response", Optics Express, Mar. 18, 2009, pp. 5193-5204, vol. 17, No. 7.
Gripp, Jürgen et al.; "Optical Switch Fabrics for Ultra-High-Capacity IP Routers"; Journal of Lightwave Technology; vol. 21; No. 11; Nov. 2003; pp. 2839-2850.
Hsu, A. et al., "Wavelength Conversion by Dual-Pump Four-Wave Mixing in an Integrated Laser Modulator", IEEE Photonics Technology Letters, Aug. 2003, pp. 1120-1122, vol. 15, No. 8.
Hu, Hao et al., "Ultra-high-speed wavelength conversion in a silicon photonic chip", Optics Express, Sep. 26, 2011, pp. 19886-19894, vol. 19, No. 21.
Hussain, Ashiq et al., "Optimization of Optical Wavelength Conversion in SOI Waveguide", Applied Mechanics and Materials, 2012, 5 pages, vol. 110-116.
International Search Report and Written Opinion of the International Searching Authority, dated Jun. 8, 2015, dated Jun. 15, 2015, Corresponding to PCT/GB2015/050523, 14 pages.
International Search Report and Written Opinion of the International Searching Authority, dated Sep. 16, 2015, Corresponding to PCT/GB2015/050524, 18 pages.
International Search Report and Written Opinion of the International Searching Authority, dated Jun. 6, 2016, Corresponding to PCT/GB2016/050570, 13 pages.
International Search Report and Written Opinion of the International Searching Authority, dated May 26, 2017, Corresponding to PCT/IT2017/000004, 13 pages.
International Search Report and Written Opinion of the International Searching Authority, dated Sep. 11, 2017, Corresponding to PCT/GB2017/051998, 15 pages.
International Search Report and Written Opinion of the International Searching Authority, dated Mar. 8, 2018, Corresponding to PCT/EP2017/080216, 14 pages.
International Search Report and Written Opinion of the International Searching Authority, dated Mar. 28, 2018, Corresponding to PCT/EP2017/083028, 14 pages.
Kachris, Christoforos et al., "Optical Interconnection Networks in Data Centers: Recent Trends and Future Challenges", IEEE Communications Magazine, Optical Technologies for Data Center Networks, Sep. 2013, pp. 39-45.
Knoll, Dieter et al., "BiCMOS Silicon Photonics Platform for Fabrication of High-Bandwidth Electronic-Photonic Integrated Circuits", IEEE, 2016, pp. 46-49.
Lal, Vikrant et al., "Monolithic Wavelength Converters for High-Speed Packet-Switched Optical Networks", IEEE Journal of Selected Topics in Quantum Electronics, Jan./Feb. 2007, pp. 49-57, vol. 13, No. 1.
Leuthold, J. et al., "All-optical wavelength conversion between 10 and 100 Gb/s with Soa delayed-interference configuration", Optical and Quantum Electronics, 2001, pp. 939-952, vol. 33, Nos. 7-10.
Lever, L. et al., "Adiabatic mode coupling between SiGe photonic devices and SOI waveguides", Optics Express, Dec. 31, 2012, pp. 29500-29506, vol. 20, No. 28.
Liao, Ling et al., "High speed silicon Mach-Zehnder modulator", Optics Express, Apr. 18, 2005, pp. 3129-3135, vol. 13, No. 8.
Liu, Ansheng et al., "High-speed optical modulation based on carrier depletion in a silicon waveguide", Optics Express, Jan. 22, 2007, pp. 660-668, vol. 15, No. 2.
Liu, Y. et al., "Error-Free 320-Gb/s All-Optical Wavelength Conversion Using a Single Semiconductor Optical Amplifier", Journal of Lightwave Technology, Jan. 2007, pp. 103-108, vol. 25, No. 1.
Maxwell, G. et al., "WDM-enabled, 40Gb/s Hybrid Integrated All-optical Regenerator", ECOC 2005 Proceedings, 2005, pp. 15-16, vol. 6.

(56) References Cited

OTHER PUBLICATIONS

Meuer, Christian et al., "80 Gb/s wavelength conversion using a quantum-dot semiconductor optical amplifier and optical filtering", Optics Express, Mar. 3, 2011, pp. 5134-5142, vol. 19, No. 6.

Moerman, Ingrid et al., "A Review on Fabrication Technologies for the Monolithic Integration of Tapers with III-V Semiconductor Devices", IEEE Journal of Selected Topics in Quantum Electronics, Dec. 1997, pp. 1308-1320, vol. 3, No. 6.

Nakamura, Shigeru et al., "168-Gb/s All-Optical Wavelength Conversion With a Symmetric-Mach-Zehnder-Type Switch", IEEE Photonics Technology Letters, Oct. 2001, pp. 1091-1093, vol. 13, No. 10.

Neilson, David T., "Photonics for Switching and Routing", IEEE Journal of Selected Topics in Quantum Electronics, Jul./Aug. 2006, pp. 669-678, vol. 12, No. 4.

Ngo, Hung Q. et al.; "Nonblocking WDM Switches Based on Arrayed Waveguide Grating and Limited Wavelength Conversion"; Proceedings 23rd Conference of IEEE Communications Soc.; 2004; 11pp.

Ngo, Hung Q. et al., "Constructions and Analyses of Nonblocking WDM Switches Based on Arrayed Waveguide Grating and Limited Wavelength Conversion", IEEE/ACM Transactions on Networking, Feb. 2006, pp. 205-217, vol. 14, No. 1.

Nishimura, Kohsuke et al., "Optical wavelength conversion by electro-absorption modulators", Active and Passive Optical Components for WDM Communications IV, Proceedings of SPIE, 2004, pp. 234-243, vol. 5595.

Office Action issued in U.S. Appl. No. 14/629,922, dated Nov. 25, 2015, 13 pages.

Office Action issued in U.S. Appl. No. 14/629,922, dated May 11, 2016, 14 pages.

Office Action issued in U.S. Appl. No. 15/369,804, dated Jul. 6, 2017, 14 pages.

Office Action issued in U.S. Appl. No. 15/555,431, dated Apr. 6, 2018, 11 pages.

Office Action issued in U.S. Appl. No. 15/927,943, dated Jun. 15, 2018, 13 pages.

Quad 40Gb/s 2R Optical Regenerator, CIP Technologies, Preliminary Datasheet, Nov. 2013, 2 pages.

Reed, Graham T., "Silicon optical modulators" materialstoday, Jan. 2005, 11 pp.

Roelkens, Gunther et al., "III-V-on-Silicon Photonic Devices for Optical Communication and Sensing", Photonics, 2015, 29 pages, vol. 2, No. 3.

Rouifed, Mohamed-Saïd et al., "Advances Toward Ge/SiGe Quantum-Well Waveguide Modulators at 1.3 µm", IEEE Journal of Selected Topics in Quantum Electronics, Jul./Aug. 2014, 7 pages, vol. 20, No. 4.

Segawa, Toru et al., "All-optical wavelength-routing switch with monolithically integrated filter-free tunable wavelength converters and an AWG", Optics Express, Feb. 17, 2010, pp. 4340-4345, vol. 18, No. 5.

Stamatiadis, C. et al., "Fabrication and experimental demonstration of the first 160 Gb/s hybrid silicon-on-insulator integrated all-optical wavelength converter", Optics Express, Feb. 1, 2012, pp. 3825-3831, vol. 20, No. 4.

Stubkjaer, Kristian E., "Semiconductor Optical Amplifier-Based All-Optical Gates for High-Speed Optical Processing", IEEE Journal on Selected Topics in Quantum Electronics, Nov./Dec. 2000, pp. 1428-1435, vol. 6, No. 6.

Summers, Joseph A. et al., "Monolithically Integrated Multi-Stage All-Optical 10Gbps Push-Pull Wavelength Converter", Optical Fiber Communication Conference, 2007, 3 pages, Anaheim, CA, USA.

Sysak, M.N. et al., "Broadband return-to-zero wavelength conversion and signal regeneration using a monolithically integrated, photocurrent-driven wavelength converter", Electronics Letters, Dec. 7, 2006, 2 pages, vol. 42, No. 25.

Tauke-Pedretti, Anna et al., "Separate Absorption and Modulation Mach-Zehnder Wavelength Converter", Journal of Lightwave Technology, 2008, pp. 1-8, vol. 26, No. 1.

Turner-Foster, Amy C. et al., "Frequency conversion over two-thirds of an octave in silicon nanowaveguides", Optics Express, Jan. 15, 2010, pp. 1904-1908, vol. 18, No. 3.

U.K. Intellectual Property Office Search Report, dated Aug. 6, 2014, for Patent Application No. GB1403191.8, 5 pages.

U.K. Intellectual Property Office Search Report, dated Sep. 5, 2014, for Patent Application No. GB1403191.8, 2 pages.

U.K. Intellectual Property Office Search Report, dated Jun. 10, 2015, for Patent Application No. GB1420063.8, 4 pages.

U.K. Intellectual Property Office Examination Report issued in GB 1403191.8 dated Dec. 2, 2015, 3 pages.

U.K. Intellectual Property Office Search and Examination Report, dated Apr. 20, 2017, for Patent Application No. GB 1703716.9, 7 pages.

U.K. Intellectual Property Office Search Report, dated Jul. 13, 2017, for Patent Application No. GB1706331.4, 3 pages.

U.K. Intellectual Property Office Examination Report, dated Aug. 10, 2017, for Patent Application No. GB1420064.6, 5 pages.

U.K. Intellectual Property Office Search and Examination Report, dated Sep. 12, 2017, for Patent Application No. GB1711525.4, 5 pages.

U.K. Intellectual Property Office Search Report, dated Sep. 19, 2017, for Patent Application No. GB1704739.0, 4 pages.

U.K. Intellectual Property Office Search and Examination Report, dated Mar. 13, 2018, for Patent Application No. GB1800519.9, 9 pages.

U.K. Intellectual Property Office Examination Report, dated Aug. 20, 2018, for Patent Application No. GB 1711525.4, 4 pages.

Vivien, L. et al., "High speed silicon modulators and detectors", ACP Technical Digest, Communications and Photonics Conference, Nov. 7, 2012, 3 pages.

Vivien, Laurent et al. "High speed and high responsivity germanium photodetector integrated in a Silicon-On-Insulator microwaveguide," Optics Express vol. 15, Issue 15, pp. 9843-9848 (2007).

Vlachos, Kyriakos et al., "Photonics in switching: enabling technologies and subsystem design", Journal of Optical Networking, May 2009, pp. 404-428, vol. 8, No. 5.

Wang, J. et al., "Evanescent-Coupled Ge p-i-n Photodetectors on Si-Waveguide With SEG-Ge and Comparative Study of Lateral and Vertical p-i-n Configurations", IEEE Electron Device Letters, May 2008, pp. 445-448, vol. 29, No. 5.

Yao, Shun et al., "A Unified Study of Contention-Resolution Schemes in Optical Packet-Switched Networks", Journal of Lightwave Technology, 2003, 31 pages, vol. 21, No. 3.

Ye, Tong et al.; "AWG-based Non-blocking Clos Networks"; IEEE/ACM Transactions on Networking; Feb. 2014; 13pp.

Chinese Patent Office Notification of the Second Office Action, for Patent Application No. 201580009961.1, dated May 13, 2019, 5 pages.

European Patent Office Communication pursuant to Article 94(3) EPC, for Patent Application No. 15 707 725.6, dated Jun. 7, 2019, 7 pages.

Examination Report issued in GB 1420063.8 dated Oct. 20, 2015, 3 pages.

Farrell, Nick, "Intel pushes photonic tech for the data center", TechRadar, Apr. 2, 2014, http://www.techradar.com/news/internet/data-centre/intel-pushes-its-photonic-tech-for-the-data-centre-1 239198, 6 pages.

Farrington, Nathan et al., "A Demonstration of Ultra-Low-Latency Data Center Optical Circuit Switching," ACM SIGCOMM Computer Communication Review, vol. 42, No. 4, 2012, pp. 95-96.

Farrington, Nathan et al., "Helios: A Hybrid Electrical/Optical Switch Architecture for Modular Data Centers", SIGCOMM'10, Aug. 30-Sep. 3, 2010, 12 Pages, New Delhi, India.

International Search Report and Written Opinion of the International Searching Authority, dated May 8, 2015 and Received May 11, 2015, Corresponding to PCT/GB2015/050520, 11 pages.

Kachris, Christoforos et al., "A Survey on Optical Interconnects for Data Centers", IEEE Communications Surveys & Tutorials, vol. 14, No. 4, Fourth Quarter 2012, pp. 1021-1036.

(56) References Cited

OTHER PUBLICATIONS

Ngo, Hung Q. et al., "Optical Switching Networks with Minimum Number of Limited Range Wavelength Converters," 24th Annual Joint Conference of the IEEE Computer and Communications Societies. Proceedings IEEE vol. 2, 2005, pp. 1128-1138.
Partial English translation of the Chinese Patent Office Notification of the Second Office Action, for Patent Application No. 201580009961. 1, dated May 13, 2019, 7 pages.
Proietti, Robert et al., "TONAK: A Distributed Low-latency and Scalable Optical Switch Architecture," 39th European Conference and Exhibition on Optical Communication, 2013, pp. 1005-1007.
Proietti, Roberto et al., "40 Gb/s 8×8 Low-latency Optical Switch for Data Centers," OSA/OFC/NFOEC 2011, 3 pages.
Stamatiadis, Christos et al., "Photonic Provisioning Using a Packaged SOI Hybrid All-Optical Wavelength Converter in a Meshed Optical Network Testbed", Journal of Lightwave Technology, Sep. 15, 2012, pp. 2941-2947, vol. 30, No. 18.
U.K. Intellectual Property Office Examination Report, dated Mar. 21, 2018, for Patent Application No. GB 1420064.6, 3 pages.
U.K. Intellectual Property Office Search Report, dated Jun. 4, 2015, Received Jun. 8, 2015, for Patent Application No. GB1420064.6, 5 pages.
U.S. Appl. No. 14/629,922, filed Feb. 24, 2015.
U.S. Appl. No. 14/827,200, filed Aug. 14, 2015.
U.S. Appl. No. 15/120,861, filed Aug. 23, 2016.
U.S. Appl. No. 15/256,321, filed Sep. 2, 2016.
U.S. Appl. No. 15/369,804, filed Dec. 5, 2016.
U.S. Appl. No. 15/430,314, filed Feb. 10, 2017.
U.S. Appl. No. 15/555,431, filed Sep. 1, 2017.
U.S. Appl. No. 15/700,053, filed Sep. 8, 2017.
U.S. Appl. No. 15/700,055, filed Sep. 8, 2017.
U.S. Appl. No. 15/833,990, filed Dec. 6, 2017.
U.S. Appl. No. 15/927,943, filed Mar. 21, 2018.
U.S. Appl. No. 16/144,994, filed Sep. 27, 2018.
U.S. Appl. No. 16/231,257, filed Dec. 21, 2018.
U.S. Appl. No. 16/275,157, filed Feb. 13, 2019.
U.S. Appl. No. 16/420,096, filed May 22, 2019.
U.S. Appl. No. 16/550,141, filed Aug. 23, 2019.
U.S. Office Action from U.S. Appl. No. 15/256,321, dated Oct. 31, 2016, 24 pages.
U.S. Office Action from U.S. Appl. No. 15/120,861, dated Apr. 25, 2018, 15 pages.
U.S. Office Action from U.S. Appl. No. 15/120,861, dated Aug. 10, 2018, 20 pages.
U.S. Office Action from U.S. Appl. No. 15/120,861, dated Nov. 17, 2017, 22 pages.
U.S. Office Action from U.S. Appl. No. 15/430,314, dated Jan. 29, 2018, 26 pages.
U.S. Office Action from U.S. Appl. No. 16/231,257, dated Oct. 24, 2019, 8 pages.
U.S. Office Action from U.S. Appl. No. 16/275,157, dated Feb. 21, 2020, 14 pages.
U.S. Office Action from U.S. Appl. No. 16/275,157, dated Sep. 6, 2019, 13 pages.
U.S. Office Action from U.S. Appl. No. 16/420,096, dated Jan. 17, 2020, 11 pages.
Website: "Intel primes market for silicon photonics to lift data centre interconnect speeds", The Inquirer, http://www.theinquirer.net/inquirer/news/234 5 61 O/intel-primes-market-for silicon-photonics-to-lift-data-centre-interconnect-speeds, printed Jan. 18, 2017, 8 pages.
Xi, Kang et al., "Petabit Optical Switch for Data Center Networks," Polytechnic Institute of New York University, Brooklyn, New York, 9 pages, 2010.
Ye, Tong et al., "A Study of Modular AWGs for Large-Scale Optical Switching Systems," Journal of Lightwave Technology, vol. 30, No. 13, Jul. 1, 2012, pp. 2125-2133.
Chinese Notification of the First Office Action, for Patent Application No. 201710650505.6, dated Mar. 21, 2019, 5 pages.
Partial English translation of the Chinese Notification of the First Office Action, for Patent Application No. 201710650505.6, dated Mar. 21, 2019, 7 pages.
U.S. Office Action from U.S. Appl. No. 16/420,096, dated Jul. 28, 2020, 10 pages.
U.S. Office Action from U.S. Appl. No. 16/550,141, dated Jul. 16, 2020, 12 pages.
U.K. Intellectual Property Office Examination Report, dated Feb. 19, 2020, for Patent Application No. GB1800519.9, 4 pages.
U.K. Intellectual Property Office Search and Examination Report, dated Dec. 20, 2019, for Patent Application No. GB1916147.0, 10 pages.
Chinese Notification of the First Office Action, for Patent Application No. 201680025793.X, dated Apr. 29, 2020, 10 pages.
Chinese Notification of the Second Office Action, for Patent Application No. 201680025793.X, dated Dec. 14, 2020, 7 pages.
Partial English translation of the Chinese Notification of the First Office Action, for Patent Application No. 201680025793.X, dated Apr. 29, 2020, 18 pages.
Partial English translation of the Chinese Notification of the Second Office Action, for Patent Application No. 201680025793.X, dated Dec. 14, 2020, 13 pages.
U.K. Intellectual Property Office Examination Report, dated Mar. 15, 2021, for Patent Application No. GB1916147.0, 3 pages.

* cited by examiner

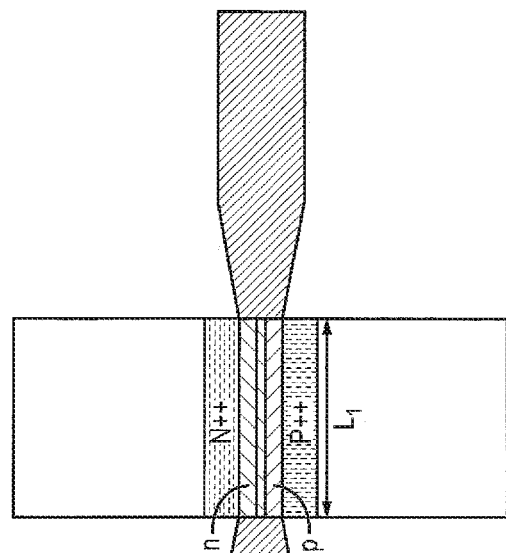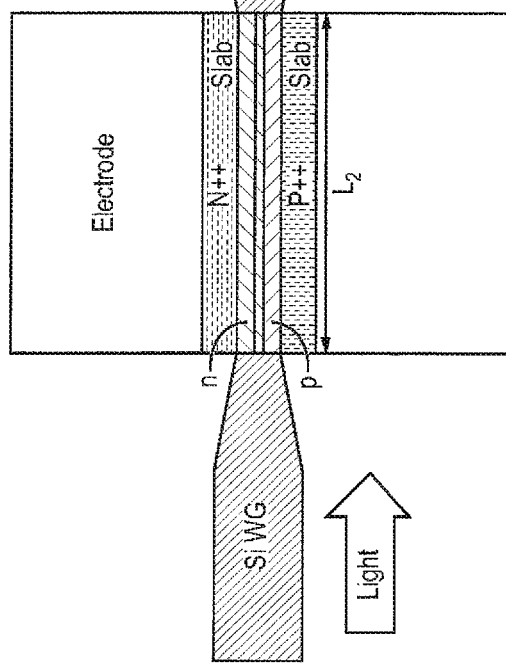
FIG. 12A
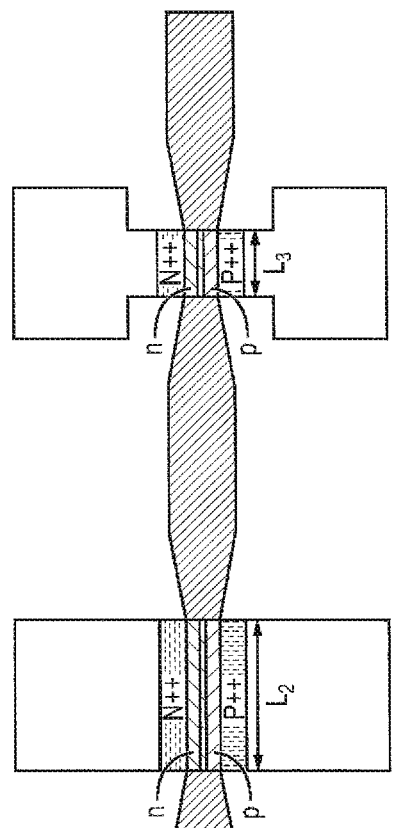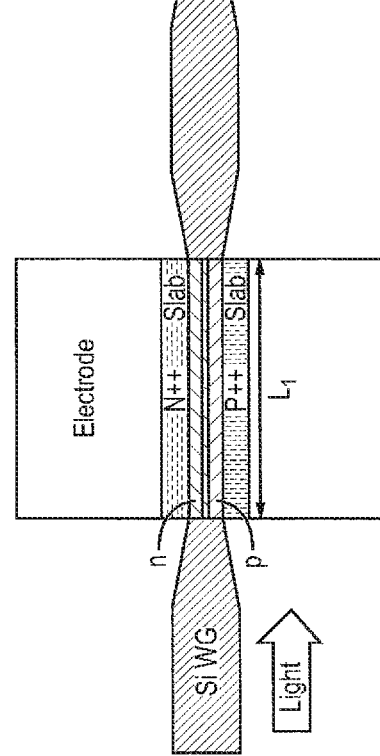
FIG. 12B

OPTICAL MODULATORS

CROSS-REFERENCE TO RELATED APPLICATIONS

The present application is a continuation-in-part of U.S. patent application Ser. No. 15/430,314, filed Feb. 10, 2017, which claims priority to and the benefit of U.S. Provisional Application No. 62/435,004, filed Dec. 15, 2016; the present application is also a continuation-in-part of U.S. patent application Ser. No. 15/700,053, filed Sep. 8, 2017, which claims the benefit of U.S. Provisional Patent Application No. 62/528,900, filed Jul. 5, 2017, and which claims priority to United Kingdom Patent Application No. GB1711525.4, filed Jul. 18, 2017; the present application is also a continuation-in-part of U.S. patent application Ser. No. 15/700,055, filed Sep. 8, 2017, which claims the benefit of U.S. Provisional Patent Application No. 62/528,900, filed Jul. 5, 2017, and which claims priority to United Kingdom Patent Application No. GB1711525.4, filed Jul. 18, 2017; the present application is also a continuation-in-part of International Patent Application No. PCT/EP2017/080216, filed Nov. 23, 2017, which claims priority to U.S. patent application Ser. No. 15/700,053, filed Sep. 8, 2017, and to U.S. patent application Ser. No. 15/700,055, filed Sep. 8, 2017, and to U.S. Provisional Patent Application No. 62/528,900, filed Jul. 5, 2017, and to United Kingdom Patent Application No. GB1711525.4, filed Jul. 18, 2017, and to U.S. Provisional Patent Application No. 62/426,117, filed Nov. 23, 2016, and to U.S. Provisional Patent Application No. 62/427,132, filed Nov. 28, 2016; the present application is also a continuation-in-part of International Patent Application No. PCT/EP2018/062269, filed May 11, 2018, which claims priority to International Patent Application No. PCT/EP2017/080221, filed Nov. 23, 2017, which claims priority to U.S. Provisional Patent Application No. 62/426,117, filed Nov. 23, 2016, and to U.S. Provisional Patent Application No. 62/427,132, filed Nov. 28, 2016. The entire contents of all of the documents identified in this paragraph are incorporated herein by reference.

FIELD

Embodiments of the present invention relate to an optoelectronic device and method of operating such a device. It particularly relates to devices within the field of silicon photonics and to an optoelectronic device comprising a first optical modulator and a second optical modulator.

BACKGROUND

Pulse-amplitude modulation (PAM) is an example modulation format where information comprising a message is encoded in the amplitude of a series of pulses comprising the signal. In PAM-4 modulation, $2^2$ (4) discrete pulse amplitudes are available, which are generally equally spaced (i.e., equally spaced in optical power, for optical data transmission). For example, as shown in FIG. 1, a PAM-4 modulation scheme enables pulses to be modulated into one of four discrete amplitudes: [0,0], [0,1], [1,0], or [1,1]. Generally adjacent amplitudes are separated by ⅓ of the largest amplitude (the so called largest bit value).

SUMMARY

At their broadest, embodiments of the invention provide PAM modulation using optoelectronic devices including optical modulators, through provision of two or more optical modulators each operable in a respective transmittance state.

Therefore, in a first aspect, embodiments of the invention provide an optoelectronic device operable to provide a PAM-N modulated output, the device comprising:

M optical modulators, M being an integer greater than 1, the M optical modulators being arranged in a cascade, the device being configured to operate in N distinct transmittance states, as a PAM-N modulator, wherein, in each transmittance state of the N distinct transmittance states, each of the M optical modulators has applied to it a respective control voltage equal to one of:

a first voltage or a second voltage.

In a second aspect, embodiments of the invention provide an optoelectronic device operable to provide a PAM-N modulated output, the device comprising:

M optical modulators, M being an integer greater than 1, the M optical modulators being arranged in a cascade, the device being configured to operate in N distinct transmittance states, as a PAM-N modulator, wherein, in each transmittance state of the N distinct transmittance states, each of the M optical modulators has applied to it a respective control voltage equal to one of k different control voltages, wherein k is an integer greater than 1 and less than 1.

A first optical modulator and a second optical modulator are operable to provide distinct transmittance states (also referred to as modulated outputs). Therefore, the device may allow at least three distinct modulated outputs corresponding to: modulation by the first modulator only, modulation by the second modulator only, modulation by the first and second modulators. This can reduce the requirement for complex drivers to implement PAM-N modulation. N may typically take any value greater than or equal to 4; generally N obeys the equation $N=2^x$, where x {Z} (i.e. is within the set of real integers). For example, N may take values of 2, 4, 8, 16, 32, 64, 128, etc.

There is disclosed a method of operating an optoelectronic device to provide a PAM-N modulated signal having the steps of:

receiving an electromagnetic wave at a first optical modulator, the first optical modulator being operable to produce a first modulated output;

receiving an electromagnetic wave at a second optical modulator, the second optical modulator being operable to produce a second modulated output which is different to the first modulated output; and independently operating the first optical modulator and the second optical modulators such that the optoelectronic device is operable to produce three distinct modulated outputs as well as an unmodulated output.

Optional features of embodiments of the invention will now be set out. These are applicable singly or in any combination with any aspect of the invention.

In some embodiments, M=N−1. For example, if PAM-4 modulation was desired, M=4−1=3, and so three optical modulators may be used.

In some embodiments, N=4; M=3; the first voltage is between 0 V and 0.2 V; and the second voltage is between 1.8 V and 2.0 V.

The optical modulators may modulate various properties of an electromagnetic wave for example: amplitude, phase, or polarisation. Typically, the optical modulators may be electro-absorption modulators, and so modulate the amplitude.

The optical modulators are in a cascade arrangement. As such, each of the optical modulators in the cascade may output electromagnetic waves into an adjacent modulator in the cascade (with the exception of the last modulator, which will output electromagnetic waves into the output waveguide). In some examples, all of the optical modulators may be in a cascade arrangement.

The device may further comprise an intermediate waveguide, disposed between a first optical modulator of the M optical modulators and a second optical modulator of the M optical modulators, and operable to convey electromagnetic waves from the first optical modulator to the second optical modulator. The intermediate waveguide may have a length of between 0.5 μm and 50 μm. A first interface between the first optical modulator and the intermediate waveguide may be at a first angle relative to a guiding direction of the intermediate waveguide, and a second interface between the second optical modulator and the intermediate waveguide may be at an opposite angle to the first angle, the first angle and opposite angle may not be right angles. By opposite, it may be meant that the opposite angle has an equal magnitude to the first angle but in an opposite sense. For example, if the first angle was 5° clockwise, the opposite angle may be 5° anti-clockwise (or, said another way, 355° clockwise). This may be represented via a minus sign, such that the first angle=5° and the opposite angle=−5°.

The optical modulators may be modulating sections of a single device i.e. regions of the device which may independently modulate an electromagnetic wave being transmitted through the device. For example, the optical modulators may be ridge waveguides in an optically active region.

A first optical modulator of the M optical modulators may have a first doped region having a first doping polarity; a second optical modulator of the M optical modulators may have a second doped region having a second doping polarity; the first doped region may be immediately adjacent to the second doped region; and the first doping polarity may be opposite to the second doping polarity.

One of the M optical modulators may have a first length along which received electromagnetic waves will travel of between 5 μm and 50 μm, and another optical modulator of the M optical modulators may have a second length along which received electromagnetic waves will travel of between 5 μm and 80 μm. Optionally the first length may vary between 15 μm and 20 μm and/or the second length may vary between 35 μm and 50 μm.

One of the M optical modulators may have a respective waveguide width substantially perpendicular to the direction in which electromagnetic waves are conveyed of between 450 nm and 1100 nm. Optionally the waveguide widths may be between 650 nm and 760 nm or 700 nm and 800 nm.

The optoelectronic device may have: a first transmittance in a first transmittance state of the N distinct transmittance states; a second transmittance in a second transmittance state of the N distinct transmittance states; and the first transmittance may be one half of the second transmittance. For example. If the first transmittance was ⅓ A, where A is 100% transmittance, then the second transmittance may be equal to ⅔ A.

The device may further comprise a heater, such that the M optical modulators are tuneable with respect to wavelength.

In a first transmittance state of the N distinct transmittance states, all of the M optical modulators may have applied to them a control voltage equal to the first voltage; and in a second transmittance state of the N distinct transmittance states, all of the M optical modulators have applied to them a control voltage equal to the second voltage.

M may be equal to 2, N may equal 4, M may equal 2, and k may equal 3. In a first transmittance state of the 4 distinct transmittance states: a first optical modulator of the 2 optical modulators has maximum transmittance; and a second optical modulator of the 2 optical modulators has maximum transmittance; in a second transmittance state of the 4 distinct transmittance states: the first optical modulator has a first transmittance, the first transmittance being less than maximum transmittance; and the second optical modulator has maximum transmittance; in a third transmittance state of the 4 distinct transmittance states: the first optical modulator has maximum transmittance; and the second optical modulator has a second transmittance, the second transmittance being less than the first transmittance; and in a fourth transmittance state of the 4 distinct transmittance states: the first optical modulator has a third transmittance, the third transmittance being less than the first transmittance; and the second optical modulator has the second transmittance. In the method, when neither modulator is used to modulate incoming light, the maximum transmittance output of the optoelectronic device may correspond, according to the IEEE P802.3bs/D1.4 Ethernet standard draft, to the "3" level of a PAM-N modulated signal representing the Gray code of the two bits {0,0}; when only the first optical modulator is used (i.e., has a transmittance less than its respective maximum transmittance), the modulated output of the optoelectronic device may correspond to the "2" level of a PAM-N modulated signal representing the Gray code of {0,1}; when only the second optical modulator is used the modulated output of the optoelectronic device may correspond to the "1" level a PAM-N modulated signal representing the Gray code of {11}; and when both the first optical modulator and second optical modulator are used the modulated output of the optoelectronic device may correspond to the "0" level of a PAM-N modulated signal representing the Gray code of {10}.

According to an embodiment of the present invention, there is provided an optoelectronic device operable to provide a PAM-N modulated output, the device including: M optical modulators, M being an integer greater than 1, the M optical modulators being arranged in a cascade, the device being configured to operate in N distinct transmittance states, as a PAM-N modulator, wherein, in each transmittance state of the N distinct transmittance states, each of the M optical modulators has applied to it a respective control voltage equal to one of: a first voltage or a second voltage, wherein one of the M optical modulators includes: a substrate; a crystalline cladding layer, on top of the substrate; and an optically active region, above the crystalline cladding layer, wherein the crystalline cladding layer has a refractive index which is less than a refractive index of the optically active region.

In some embodiments, M=N−1.

In some embodiments: N=4; M=3; the first voltage is between 0 V and 0.2 V; and the second voltage is between 1.8 V and 2.0 V.

In some embodiments, an optical modulator of the M optical modulators is an electro-absorption modulator.

In some embodiments, the optoelectronic device further includes an intermediate waveguide, disposed between a first optical modulator of the M optical modulators and a second optical modulator of the M optical modulators, and operable to convey electromagnetic waves from the first optical modulator to the second optical modulator.

In some embodiments, a first interface between the first optical modulator and the intermediate waveguide is at a first angle relative to a guiding direction of the intermediate waveguide, and a second interface between the second optical modulator and the intermediate waveguide is at an opposite angle to the first angle, wherein the first angle is not a right angle and the opposite angle is not a right angle.

In some embodiments, the M optical modulators are optically active regions of a ridge waveguide.

In some embodiments: the optoelectronic device has a first transmittance in a first transmittance state of the N distinct transmittance states; the optoelectronic device has a second transmittance in a second transmittance state of the N distinct transmittance states; and the first transmittance is one half of the second transmittance.

In some embodiments, the optoelectronic device further includes a heater, such that the M optical modulators are tuneable with respect to wavelength.

In some embodiments: in a first transmittance state of the N distinct transmittance states, all of the M optical modulators have applied to them a control voltage equal to the first voltage; and in a second transmittance state of the N distinct transmittance states, all of the M optical modulators have applied to them a control voltage equal to the second voltage.

In some embodiments, M=2.

In some embodiments, the optoelectronic device further includes the refractive index of the crystalline cladding layer is at most 0.95 times the refractive index of the optically active region.

According to an embodiment of the present invention, there is provided an optoelectronic device operable to provide a PAM-N modulated output, the device including: M optical modulators, M being an integer greater than 1, the M optical modulators being arranged in a cascade, the device being configured to operate in N distinct transmittance states, as a PAM-N modulator, wherein, in each transmittance state of the N distinct transmittance states, each of the M optical modulators has applied to it a respective control voltage equal to one of k different control voltages, wherein k is an integer greater than 1 and less than N, and wherein one of the M optical modulators includes: a substrate; a crystalline cladding layer, on top of the substrate; and an optically active region, above the crystalline cladding layer, wherein the crystalline cladding layer has a refractive index which is less than a refractive index of the optically active region.

In some embodiments, the M optical modulators are electro-absorption modulators.

In some embodiments: N=4; M=2; and k=3.

In some embodiments: in a first transmittance state of the 4 distinct transmittance states: a first optical modulator of the 2 optical modulators has maximum transmittance; and a second optical modulator of the 2 optical modulators has maximum transmittance; in a second transmittance state of the 4 distinct transmittance states: the first optical modulator has a first transmittance, the first transmittance being less than maximum transmittance; and the second optical modulator has maximum transmittance; in a third transmittance state of the 4 distinct transmittance states: the first optical modulator has maximum transmittance; and the second optical modulator has a second transmittance, the second transmittance being less than the first transmittance; and in a fourth transmittance state of the 4 distinct transmittance states: the first optical modulator has a third transmittance, the third transmittance being less than the first transmittance; and the second optical modulator has the second transmittance.

In some embodiments, the optoelectronic device further includes an intermediate waveguide, disposed between a first optical modulator of the M optical modulators and a second optical modulator of the M optical modulators and operable to convey electromagnetic waves from the first optical modulator to the second optical modulator.

In some embodiments, a first interface between the first optical modulator and the intermediate waveguide is at a first angle relative to a guiding direction of the intermediate waveguide, and a second interface between the second optical modulator and the intermediate waveguide is at an opposite angle to the first angle, wherein the first angle is not a right angle and the opposite angle is not a right angle.

In some embodiments, a first optical modulator of the M optical modulators and a second optical modulator of the M optical modulators are optically active regions of a ridge waveguide.

In some embodiments: the optoelectronic device has a first transmittance in a first transmittance state of the N distinct transmittance states; the optoelectronic device has a second transmittance in a second transmittance state of the N distinct transmittance states; and the first transmittance is one half of the second transmittance.

In some embodiments, the optoelectronic device further includes a heater, such that an optical modulator of the M optical modulators is tuneable with respect to wavelength.

In some embodiments: in a first transmittance state of the N distinct transmittance states, all of the M optical modulators have applied to them a control voltage equal to a first voltage; and in a second transmittance state of the N distinct transmittance states, all of the M optical modulators have applied to them a control voltage equal to a second voltage.

In some embodiments, M is greater than or equal to Log 2(N).

In some embodiments, the refractive index of the crystalline cladding layer is at most 0.95 times the refractive index of the optically active region.

BRIEF DESCRIPTION OF THE DRAWINGS

Embodiments of the invention will now be described by way of example with reference to the accompanying drawings in which:

FIGS. 12A and 12B show further variant optoelectronic devices;

DETAILED DESCRIPTION

Figure 1:
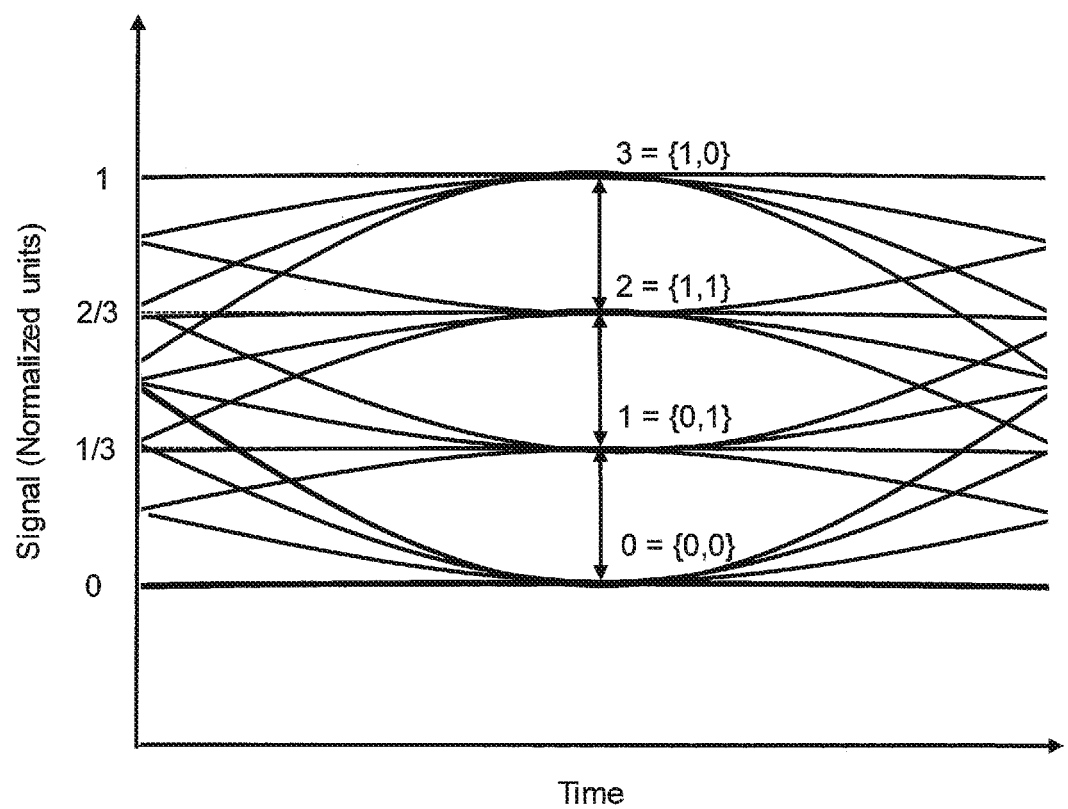
FIG. 1 is an eye diagram showing the modulation states of a PAM-4 modulated signal.
Figure 2:
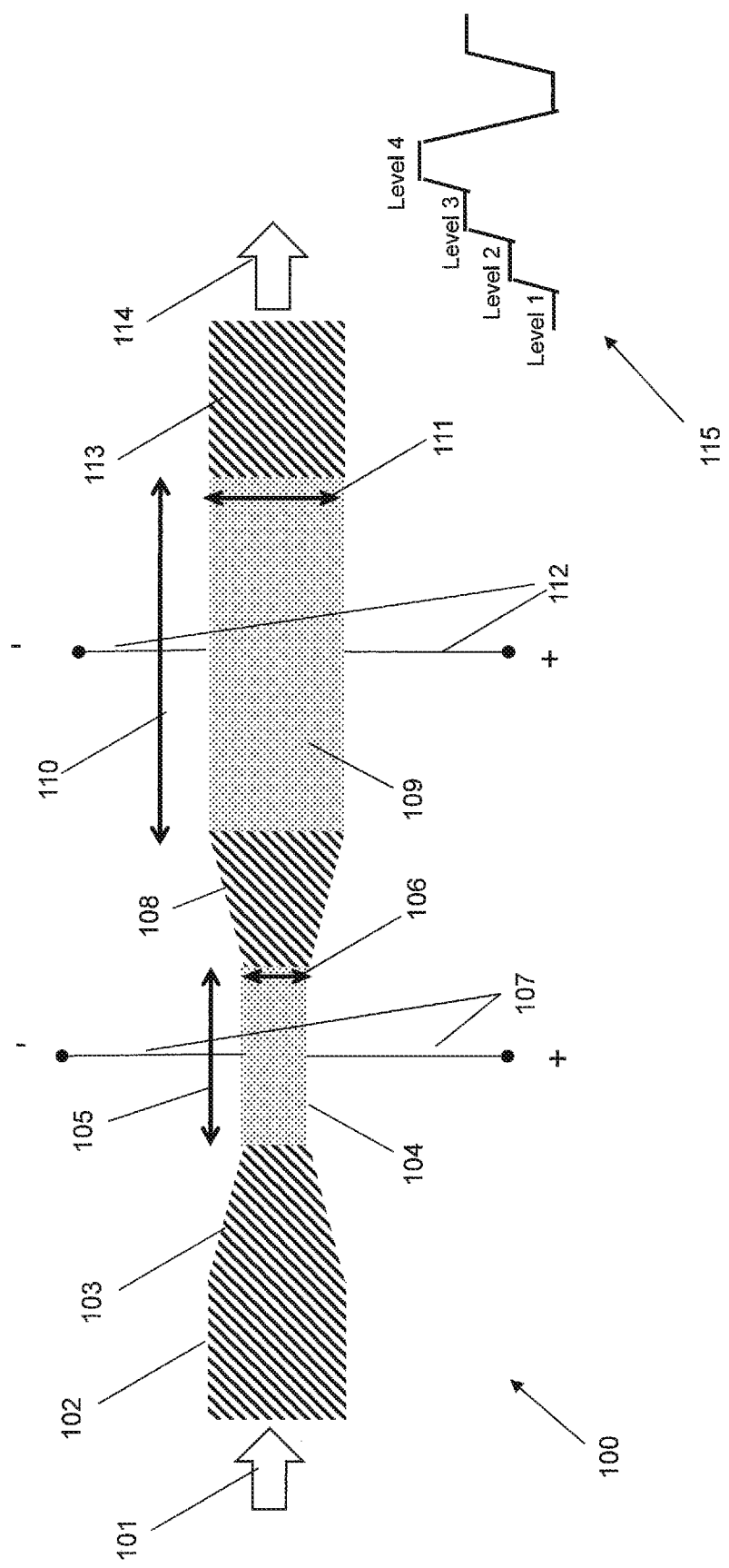
FIG. 2 is a schematic view of an optoelectronic device capable of PAM-4 modulation.

FIG. 2 shows, schematically, an optoelectronic device capable of PAM-4 modulation. Electromagnetic waves 101 may be presented to an input waveguide 102 at a first end of the device. The waves are guided from the input waveguide, through a tapered region 103 and into the first optical modulator 104. as the optical modulator may be an electro-optical modulator (EOM) in that it may utilize an electro-optical effect (for example, the Franz-Keldysh effect if the electro-optical modulator was an electro-absorption modulator). The first optical modulator has an associated length $L_1$ 105 along which the waves are guided, as well as an associated waveguide width $W_1$ 106 which is substantially perpendicular to the length. The first optical modulator is operable, via electrodes 107, to operate in various transmittance states, by applying to this and each optical modulator a respective control voltage selected from three different control voltages (e.g., 0 V, 1.4 V, and 2 V, as shown in the list below). For example, the optical modulator may be operable in either a maximum transmittance state or in a state with less than maximum transmittance, depending on the desired output of the device. In the examples where the optical modulator is an electro-absorption modulator, the optical modulator may be operated in either (i) a transmittance state of maximum transmittance or (ii) a transmittance state of less than maximum transmittance. By switching between two or more such transmittance states, the optical modulator may modulate the light propagating through the device, where "modulating" the light propagating through the device means imposing a time-varying attenuation on light transmitted through the device. The electrodes may be operable in three states for the first optical modulator, or in two states (for the second optical modulator), each state corresponding to a control voltage. For example, the optical modulators may have applied to them the control voltages listed below, to produce the four PAM-4 levels:

Level 3: ER4=0 dB: V1=0V, V2=0V
Level 2: ER3=1.05 dB: V1=1.4V, V2=0V
Level 1: ER2=2.44 dB: V1=0V, V2=2V
Level 0: ER1=4.5 dB: V1=2V, V2=2V.

In the list above, ER (e.g., ER1, ER2, etc.) is the respective extinction ratio of the optoelectronic device (and the transmittance is the opposite, in dB, e.g., an extinction ratio of 2.44 dB corresponds to a transmittance of −2.44 dB). In an alternate embodiment, Level 2 is produced using V1=1V and V2=1V. Each optical modulator may have maximum transmittance when the applied control voltage is 0V, and reduced transmittance for higher control voltages. As used herein, an "optical modulator" is an optical element with electrically controlled optical transmittance, such as an electro-absorption modulator (EAM) as discussed above.

The waves are then guided into a first end of an intermediate waveguide 108, which has a taper so as to match the waveguide width of a second optical modulator 109 disposed at the opposing end. The waveguide width may affect the degree to which light is attenuated by any given optical modulator. The intermediate waveguide 108 can be formed of either undoped Si or undoped SiGe and may have a length of between 0.5 μm and 10 μm or 1 μm and 2 μm. The second optical modulator has an associated length $L_2$ 110 along which the waves are guided, as well as an associated waveguide width $W_2$ 111 which is substantially perpendicular to the length. The length and waveguide width of the second optical modulator is different to the length and waveguide width of the first optical modulator. In this example, this allows the first and second optical modulators to operate in different transmittance states as the length and width of the optical modulators is a factor in determining the degree to which electromagnetic waves are attenuated by the optical modulator. As with the first optical modulator, the second optical modulator is controllable by an electrode 112. Table 1 below show indicative values for the length and waveguide widths of the optical modulator as well as the length of the intermediate waveguide:

TABLE 1

| Parameter | Base design value | Range |
| --- | --- | --- |
| $L_1$ | 15-20 [μm] | 5-50 [μm] |
| $L_2$ | 35-50 [μm] | 5-80 [μm] |
| $d_1$ | 1-2 [μm] | 0.5-10 [μm] |
| $W_1$ | 650-750 [nm] | 450-1100 [nm] |
| $W_2$ | 700-800 [nm] | 450-1100 [nm] |

The waves are then guided into an output waveguide 113, and exit the device. In the lower-right corner of FIG. 2 an example 115 of transmittance states is shown indicating the optical power output corresponding to various transmittance states of the device. Level 4 corresponds to maximum transmittance when both optical modulators have zero control voltages (i.e. 0 V and 0 V) applied to them. Level 3 and 2 correspond to the cases where a non-zero control voltage is applied to only one optical modulator while the other has 0 V applied to it, and finally level 1 corresponds to both the first and second optical modulators having non-zero control voltage applied to them. By design all of the 4 optical output power levels are equally spaced.

Figure 3:
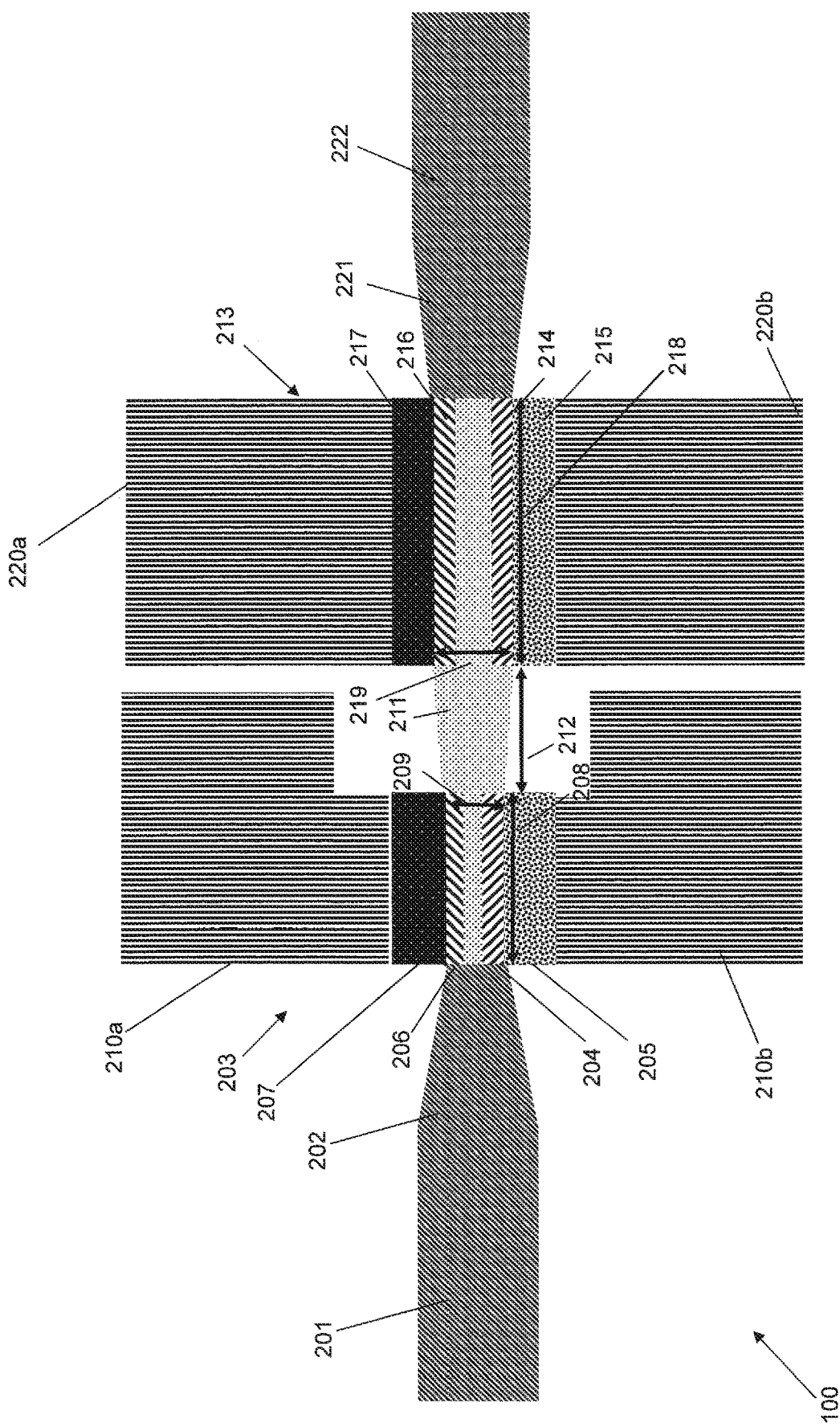
FIG. 3 is a detailed schematic of the device of FIG. 2.

FIG. 3 shows in more detail the device 200 shown in FIG. 2. In this example, the input waveguide 201 is formed of Si and connects via tapered region 202 with a waveguide ridge comprising SiGe having width $w_1$ 209. The waveguide ridge could instead comprise any one or more of Ge, SiGeSn, or GeSn. The waveguide ridge has a lightly doped region of a first species 204, and adjacent to this, in a slab portion, is a heavily doped region 205 of the same species. Opposing this in the width direction, and again present in the ridge waveguide, is a lightly doped region of a second species 206 which is adjacent to, in the slab portion, a heavily doped region 207 of the same second species. The heavily doped regions 205, 207 are connected to respective electrodes 210a and 210b. The lightly doped regions have a length $L_1$ 208 which corresponds to the length of the first optical modulator.

Adjacent to a distal end of both of the first optical modulator's lightly doped regions is an intermediate waveguide 211 which can be formed of either undoped SiGe or undoped Si. As the second optical modulator 213 has a different waveguide width 219 to the first optical modulator 203, the intermediate waveguide acts to taper from the first width to the second width. Therefore, the waves are guided from the first optical modulator, through the intermediate waveguide and into the second optical modulator.

The second optical modulator 203, like the first optical modulator has lightly and heavily doped regions. Innermost, and within a waveguide ridge of the second optical modulator, is a region 214 lightly doped with a first species and a region 216 lightly doped with a second species. These regions oppose each other in the width direction. Adjacent to each lightly doped region, and within a slab, are respective heavily doped regions 215 and 217. The region 215 is heavily doped with the same species of dopant as lightly doped region 214, and region 217 is heavily doped with the same species of dopant as lightly doped region 216.

At a distal end of the second optical modulator 203 to the intermediate waveguide 211 is an output waveguide 222. The output waveguide has a tapered region 221, which tapers from the waveguide width $w_2$ 219 of the second optical modulator to a second width.

Figure 4:
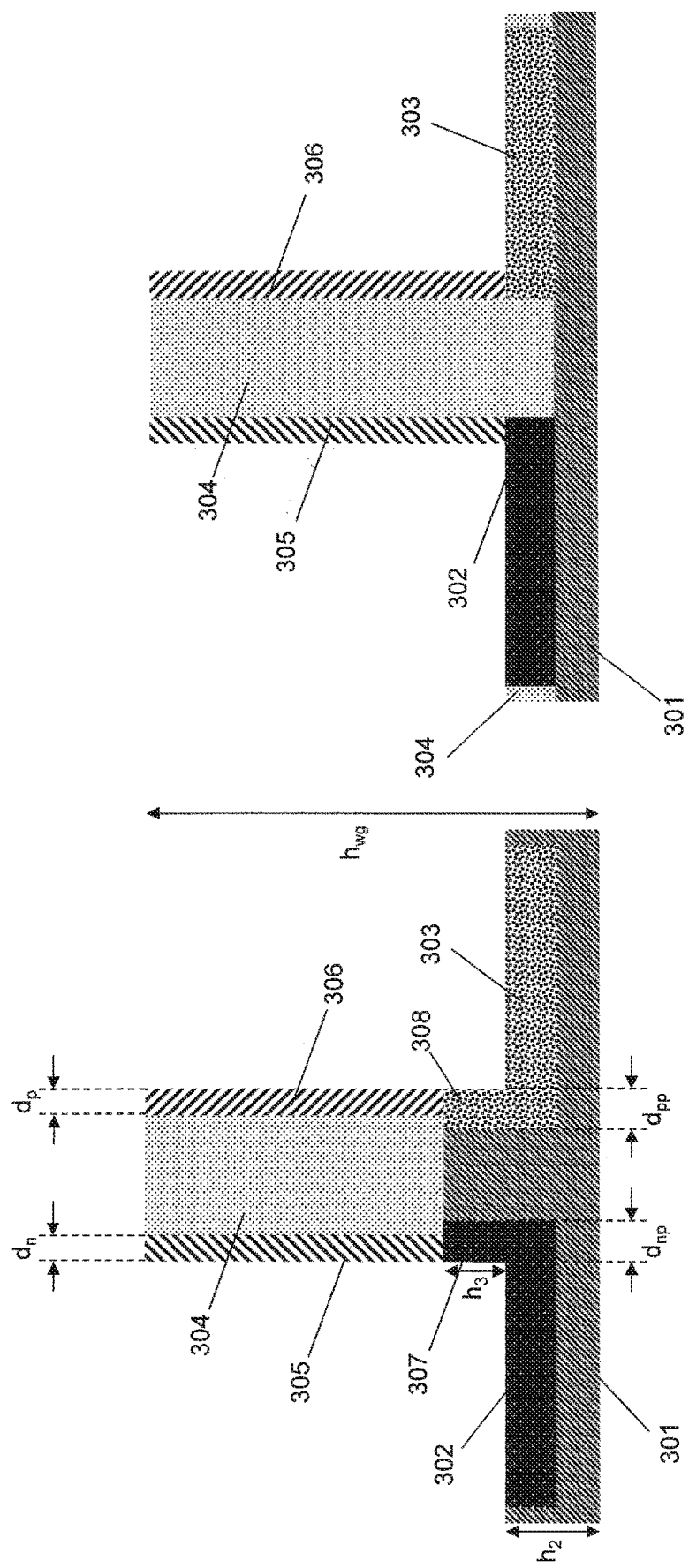
FIGS. 4A and 4B schematically show variant waveguide ridge structures.

FIGS. 4A and 4B show variant waveguide ridge structures that could be used in either optical modulator. Each is formed of a Si slab which provides a slab layer. In the example shown in FIG. 4A the Si slab has heavily doped regions 302 and 303 which are doped with a different polarity dopant e.g. N++ and P++ or P++ and N++ respectively. The slab has been etched to provide a ridge portion of Si, and the heavily doped regions partially extend along this ridge into regions 307 and 308. On top of the ridge portion of Si is a SiGe (or any other optically active material) ridge 304, which has been lightly doped in regions 305 and 306. The dopant in region 305 has the same polarity as the dopant in region 302, but its concentration is reduced in comparison. Similarly, the dopant in region 306 has the same polarity as the dopant in region 303 but its concentration is also reduced in comparison.

FIG. 4A is annotated with various dimensions. These include $h_{wg}$—the total height of the ridge waveguide; $h_2$—the height of the slab; $h_3$—the height along which the heavily doped regions extend; $d_n$—the depth into the sidewall of the ridge that the first dopant penetrates; $d_p$—the depth into the sidewall ridge that the second dopant penetrates; $d_{np}$—the depth into the sidewall that the heavily doped first dopant penetrates; and $d_{pp}$ the depth into the sidewall that the heavily doped second doped penetrates. $h_{wg}$ may have a value of around 3 μm (+/−5%).

The tolerances of the values are shown in table 2 below, and table 3 indicates example dopant ranges for example dopants:

TABLE 2

| Dimension | Tolerance [nm] |
|---|---|
| $h_{wg}$ | 100-800 |
| $h_2$ | 100-400 |
| $h_3$ | 0-400 |
| $d_{np}$ | 50-300 |
| $d_{pp}$ | 50-300 |
| $d_p$ | 50-300 |
| $d_n$ | 50-300 |

TABLE 3

| Doping type | Doping range [cm$^{-3}$] |
|---|---|
| N | $1 \times 10^{15}$ to $1 \times 10^{20}$ |
| P | $1 \times 10^{15}$ to $1 \times 10^{20}$ |
| N++ | $1 \times 10^{18}$ to $1 \times 10^{20}$ |
| P++ | $1 \times 10^{18}$ to $1 \times 10^{20}$ |

A variant ridge waveguide structure is shown in FIG. 4B. In this example, the Si slab layer 301 has a SiGe layer 304 immediately on top. The SiGe layer is doped to produce the heavily doped regions 302 303 as well as the lightly doped regions 305 306. The lightly doped regions are, again, present in a ridge 304 of the ridge waveguide structure. In this example, the heavily doped regions do not extend up the ridge of the waveguide. Of course, the features described in relation to the first variant (FIG. 4A) are applicable where appropriate to the second variant. For example, a SiGe layer 304 could be provided atop the Si slab layer 301 in the first variant, where the heavily doped regions partially extend up the side of the ridge 304 of the waveguide.

Figure 5:
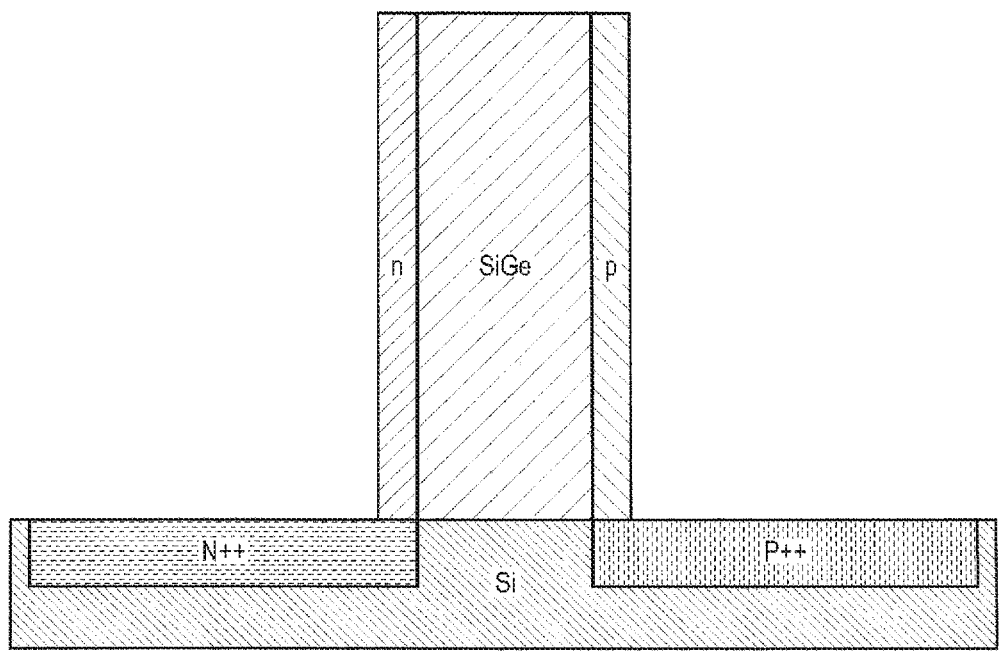
FIG. 5 schematically shows a further variant waveguide ridge structures.

FIG. 5 shows a further variant ridge waveguide structure. FIG. 5 is an example where the heavily doped regions (N++ and P++) are provided in the Si slab layer, and do not extend into the SiGe ridge.

Figure 6:
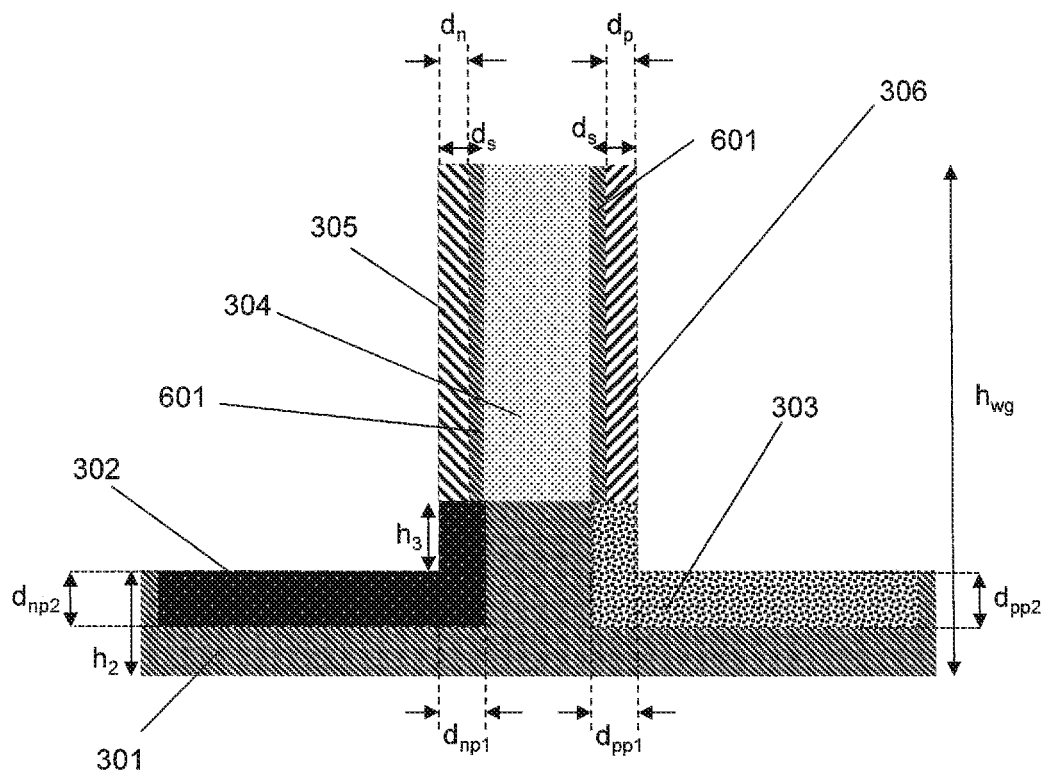
FIG. 6 shows a variant waveguide ridge structure.

FIG. 6 shows a variant ridge waveguide structure. This structure shares a number of features with previously discussed ridge waveguide structures, and so like reference numerals are used for like parts. The structure in FIG. 6 differs from that in FIG. 4A in that a Si, SiGe, or SiGeSn layer 601 is provided between the ridge 304 and each of the lightly doped regions 305 and 306. This layer 601 should have a lower refractive index with respect to the material making up the ridge 304. The distances $d_{np2}$ and $d_{pp2}$ indicate, respectively, the depth into the slab 301 that the heavily doped regions are doped. The tolerance on this measurement should be between 50 and 300 nm.

Figure 7:
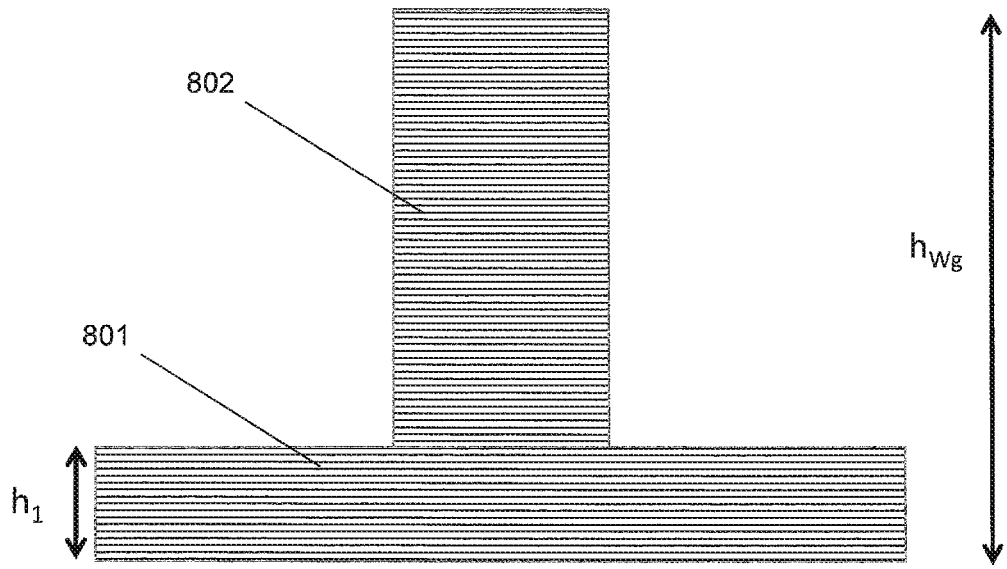
FIG. 7 shows an example of an input or output waveguide.

FIG. 7 shows an example of an input or output Si passive waveguide 201 or 222, The input and output waveguides respectively comprise a slab portion 801 having height $h_1$ and a ridge portion 802, the ridge and slab having a combined height of $h_{wg}$. $h_1$ should have a tolerance of between 100-800 nm, and $h_{wg}$ should have a value of around 3 μm (+ or −5%).

Figure 8:
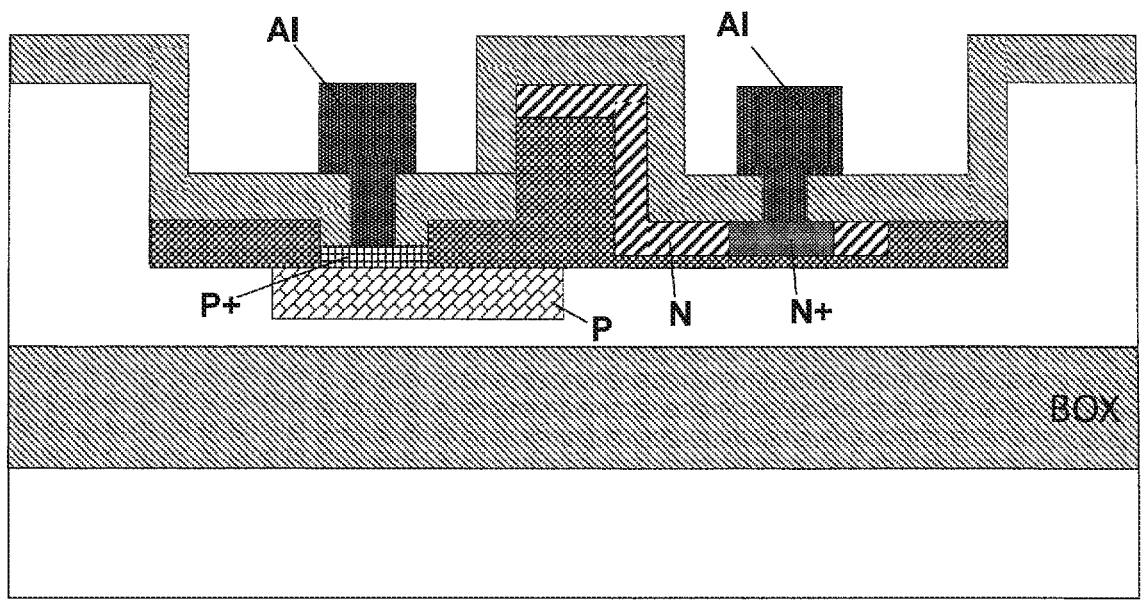
FIG. 8 shows a variant waveguide ridge structure.

FIG. 8 shows a variant ridge waveguide structure. Here, instead of the doped regions extending vertically up sidewalls of the ridge waveguide, they are disposed in upper and lower doped regions of the waveguide ridge. As can be seen in FIG. 8, an N doped region extends across the top of the central portion of the waveguide, and is connected to an N+ doped region which is in turn connected to an electrode contact. Similarly, a P doped region extends below the central portion of the waveguide, and is connected to a P+ doped region which is in turn connected to a separate electrode contact. The lower doped region exhibits a multilayer structure. The multilayer structure comprises a first doped region (i.e. a first layer) formed from an implanted doped portion of the silicon-on-insulator (SOI) located directly below the optically active region (OAR). A second doped zone (i.e. a second layer) is formed by implanting dopants into the OAR itself at a region of the OAR located directly above the first doped zone. The second doped zone has a dopant concentration greater than that of the first doped zone. The lower surface of the second doped zone forms the interface between the first doped zone and the second doped zone. The upper surface of the second doped zone forms the contact surface for a corresponding electrode.

As discussed above, the first doped zone of the lower doped region is P doped, and the second doped zone of the lower doped region is P+ doped (where P+ denotes a P doped region with a greater concentration of P dopants). The upper doped region contains an upper doped region in the form of an N doped region which comprises: an upper N doped waveguide region extending across the upper surface of the OAR waveguide; a lateral N doped region which extends outwards away from the waveguide; and a connecting N doped region which extends vertically along a side of the waveguide to connect the upper N doped waveguide region with the upper lateral N doped region. The connecting N doped region, the upper later N doped region, and the upper N doped waveguide region form a single contiguous N doped region. The OAR comprises the waveguide ridge and slab regions at either side of the waveguide so that the OAR has an inverted T-shape cross section (the cross section taken transverse to the longitudinal axis of the waveguide). The P+, N, and N+ doped regions are all located within the OAR material, whilst the N region extends along the top and the side of the waveguide ridge as well as the slab, the N+ and P+ regions are only found within the slab sections of the OAR, either side of the waveguide ridge.

In other embodiments (not shown) the P and N doped regions are reversed so that the lower doped region contains an N doped zone and an N+ doped zone so that the upper doped region is P doped and P+ doped.

In this embodiment, an extra step of etching a region of the OAR (e.g. SiGe) has occurred before that region is implanted to form a P+ doped region. This etching process creates a P+ region of the OAR which has a reduced height as compared to the slab within which it is located.

By etching the slab region of the OAR before the P+ doping takes place, it is easier to ensure that the P and P+ doped regions are connected; that is to say that the P+ dopant region (the second zone of the multilayer lower doped portion) reaches through the thickness of the slab from the contact surface at the top surface to the P doped region at the bottom surface. The thickness of the second zone of the multilayer lower doped portion is 0 μm-0.2 μm. Where the thickness has a value of 0 μm, this should be understood to mean that the P+ dopant region is completely inside of the P region.

Figure 9:
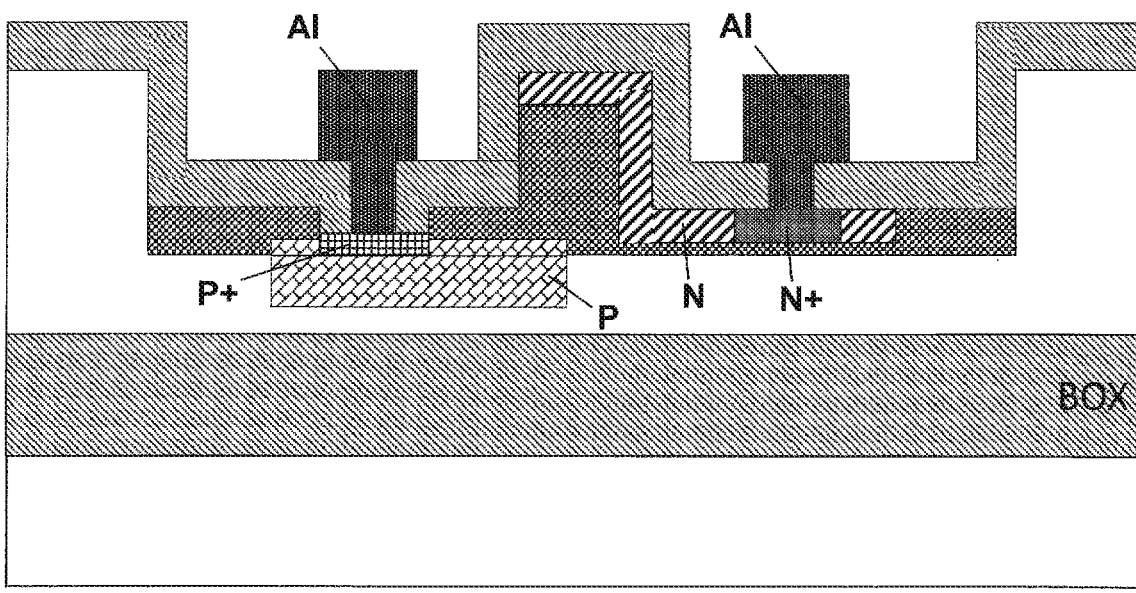
FIG. 9 shows a further variant waveguide ridge structure.

In FIG. 9, an annealing process has taken place which causes the P doped region to diffuse into the central portion of the waveguide from below by a distance of between 50-200 nm. This "migrated" area caused by the dopant diffusion can be beneficial in reducing the series resistance and increasing the bandwidth of the optical modulator. The diffusion can occur in any of the embodiments described herein.

Figure 10:
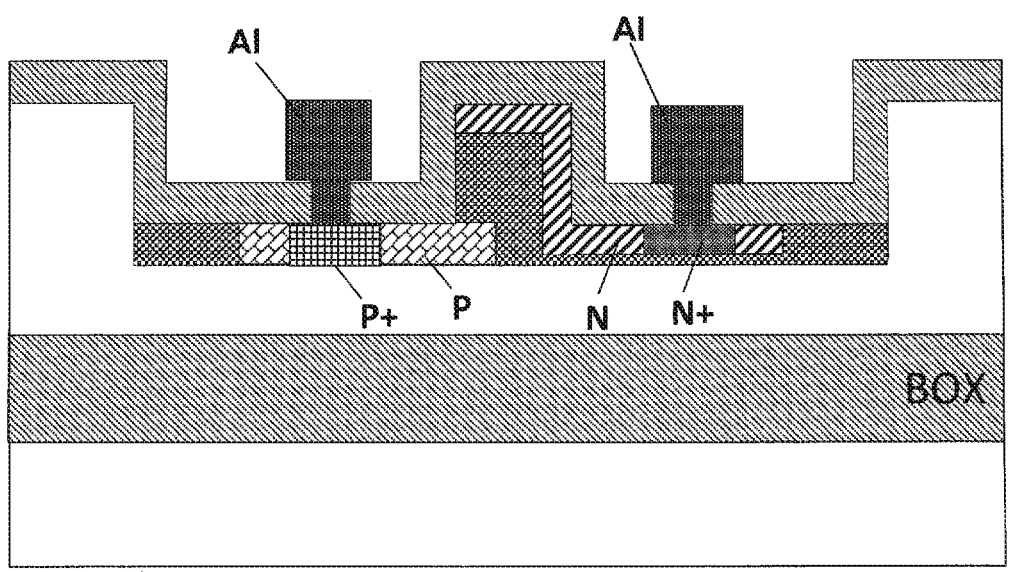
FIG. 10 shows a further variant waveguide ridge structure.

FIG. 10, in contrast to FIG. 9, shows a device where the P doped region has diffused from a side of the central portion of the waveguide horizontally into the central portion of the OAR waveguide. Furthermore, this device is based on an 800 nm cross-section, whereas some previous examples are based on a 3 μm cross-section. Both forms of devices are suitable for implementing the PAM-N modulation scheme as discussed.

In some embodiments, one or more of the modulators of the optoelectronic device are fabricated according to a method disclosed in U.S. patent application Ser. No. 15/700,053 and U.S. patent application Ser. No. 15/700,055, both of which are incorporated herein by reference. The optically active region of such a modulator may be part of a waveguide on a crystalline cladding layer (instead of, e.g., the BOX (buried oxide) cladding layer shown in FIGS. 8-10), and the optically active region above the crystalline cladding layer may be the modulating component of the modulator.

Figure 11:
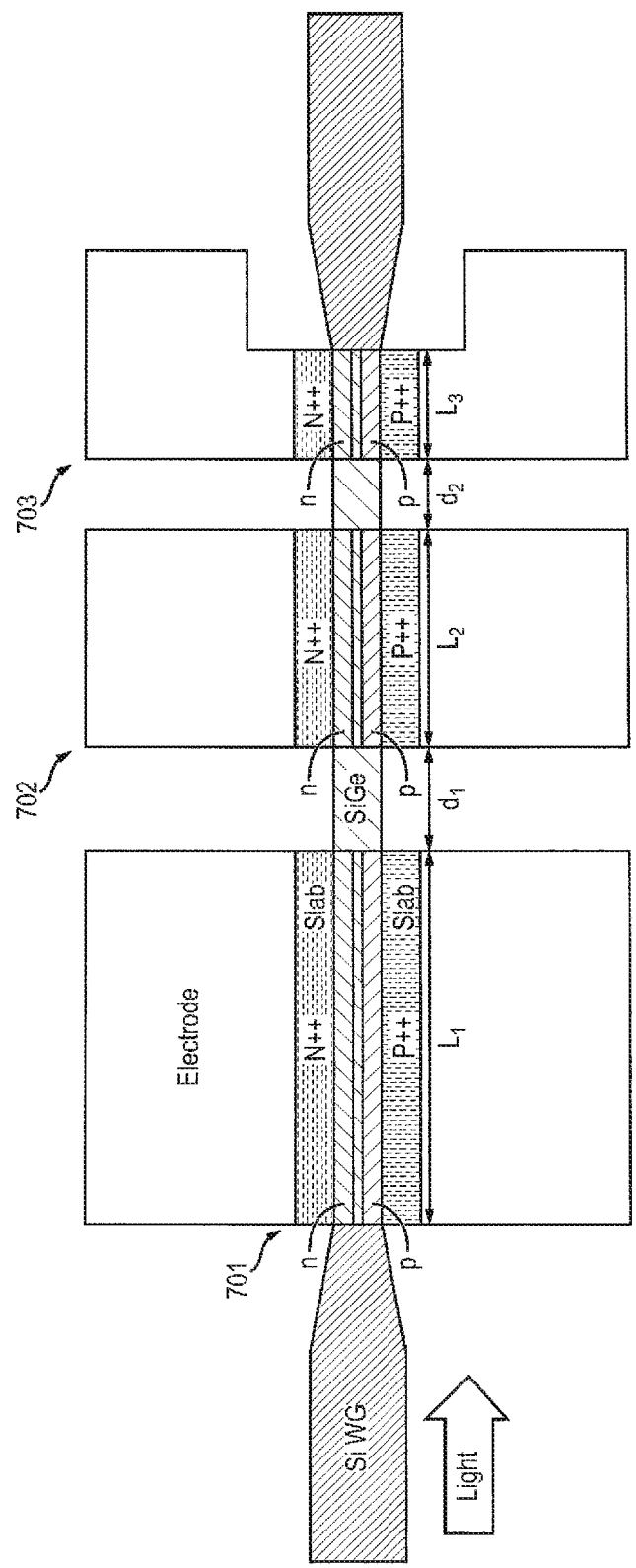
FIG. 11 shows a variant optoelectronic device capable of PAM-4 modulation.

FIG. 11 shows a variant optoelectronic device comprising three optical modulators, a first 701, second 702, and third 703. Each of the optical modulators has a different length as can be seen. In this example $L_1 > L_2 > L_3$ (where corresponds to the $n^{th}$ optical modulator). As will be understood, the length of an optical modulator correlates with the magnitude of the modulation it will impart on electromagnetic waves being guided through it. Therefore, in this example, the first optical modulator will impart a greater magnitude of modulation to the electromagnetic waves than both the second or third.

Thus, in some embodiments, pairs of optical modulators can be operated substantially simultaneously in order to provide further tuning between the modulation outputs of the device, to give an additional degree of freedom for the device driver to drive PAM-4 modulation. In other embodiments, the three levels can be controlled independently in such a manner as to avoid relying upon the product of two optical modulator extinction settings (e.g., to produce PAM-4, three optical modulators may be used, and in each of the four transmittance states corresponding to the four levels of PAM-4, at least two of the three optical modulators may have 0 V applied to them as the control voltage). The following table, Table 4, gives an example of where the three levels can be controlled independently:

TABLE 4

| PAM-4 Level | $1^{st}$ Optical Modulator | $2^{nd}$ Optical Modulator | $3^{rd}$ Optical Modulator |
|---|---|---|---|
| 3 | 0 | 0 | 0 |
| 2 | 1 | 0 | 0 |
| 1 | 0 | 1 | 0 |
| 0 | 0 | 0 | 1 |

The following table, Table 5, gives an example where three optical modulators can be operated to produce PAM-4 modulated outputs (where 1 indicates that the optical modulator is being used to attenuate the electromagnetic waves, and 0 indicates that it is not). In one embodiment, each value of 0 listed below an optical modulator in Table 4 corresponds to applying a respective control voltage equal to a first voltage (e.g., 0 V) to the optical modulator, and each value of 1 corresponds to applying a respective control voltage equal to a second voltage (e.g., 2 V) to the optical modulator. A cascade of three modulators configured to operate in this manner may be driven by a particularly simple drive circuit having three outputs and including, for example, (i) a first set of three transistors, each of which, when turned on, connects a respective output, of the three outputs, to ground (i.e., 0 V), and (ii) a second set of three transistors, each of which, when turned on, connects a respective output, of the three outputs, to a power supply voltage (e.g., 2 V).

TABLE 5

| PAM-4 Level | $1^{st}$ Optical Modulator | $2^{nd}$ Optical Modulator | $3^{rd}$ Optical Modulator |
|---|---|---|---|
| 3 | 0 | 0 | 0 |
| 2 | 1 | 0 | 0 |
| 1 | 1 | 1 | 0 |
| 0 | 1 | 1 | 1 |

A further example is shown in Table 6, where the third optical modulator is operated simultaneously with the second optical modulator (in one embodiment, for example, $V_1=0$ V, $V_2=1.4$ V, and $V_3=2$):

TABLE 6

| PAM-4 Level | 1st Optical Modulator | 2nd Optical Modulator | 3rd Optical Modulator |
|---|---|---|---|
| 3 | $V_1$ | $V_1$ | $V_1$ |
| 2 | $V_2$ | $V_1$ | $V_1$ |
| 1 | $V_1$ | $V_3$ | $V_3$ |
| 0 | $V_3$ | $V_3$ | $V_3$ |

Alternatively, the third optical modulator could be operated independently of the first and second optical modulator i.e. it could be used to generate a PAM level of modulation without necessarily being used in conjunction with another optical modulator. Therefore, a PAM-8 level modulation scheme would be possible. In some embodiments another modulation scheme, referred to herein as "N-level modulation", may be implemented using $Log_2$ (N) modulators. Unlike PAM-N modulation (in which the N levels are equally spaced), N-level modulation may have optical power levels that are not equally spaced (they may be logarithmically spaced, for example). 8-level modulation, for example, may be generated using three cascaded modulators, each operated in one of two respective transmittance states, as shown in Table 7:

TABLE 7

| PAM-8 Level | 1st Optical Modulator | 2nd Optical Modulator | 3rd Optical Modulator |
|---|---|---|---|
| 7 | 0 | 0 | 0 |
| 6 | 1 | 0 | 0 |
| 5 | 0 | 1 | 0 |
| 4 | 0 | 0 | 1 |
| 3 | 1 | 1 | 0 |
| 2 | 1 | 0 | 1 |
| 1 | 0 | 1 | 1 |
| 0 | 1 | 1 | 1 |

As will be recognised, an N-level modulation scheme is possible by providing at least M optical modulators where M=$Log_2$ (N). Said another way, by providing M optical modulators, an N-level modulation scheme is possible with $2^M$ levels.

In the example shown in FIG. 11, the three optical modulators 701, 702, and 703 are provided within a single SiGe ridge waveguide. This can reduce the number of interfaces where the electromagnetic waves must move from a material of one refractive index to another (this having associated reflection losses). However, this is not necessary. As shown in FIGS. 12A and 12B, it is possible to provide Si waveguides between each of the optical modulators. This may aid manufacturability and have improved performance since intermediate Si waveguides will have less loss.

Figure 13A:
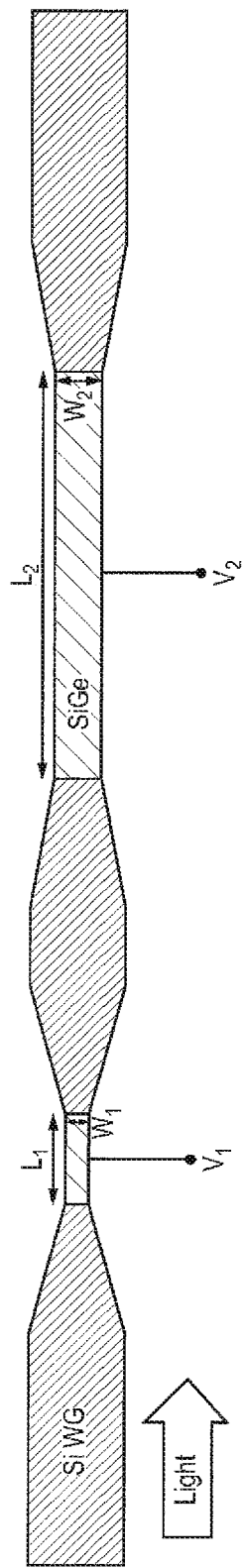
FIGS. 13A and 13B show further variant optoelectronic devices.
Figure 13B:
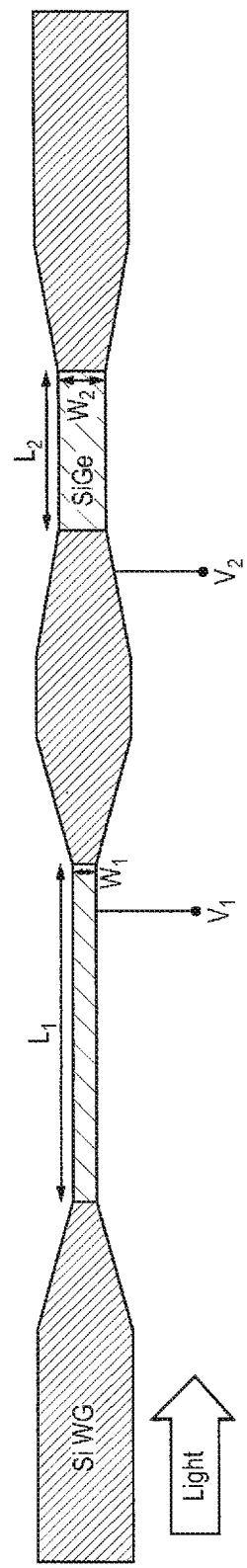

For example, as is shown in FIGS. 13A and 13B, the lengths and/or widths of the optical modulators within a device according to embodiments of the invention may differ markedly. In the example in FIG. 13A, the length $L_1$ and width $W_1$ of the first optical modulator is much reduced in comparison to the length $L_2$ and width $W_2$ of the second optical modulator. However, the length and width can be varied in order to tune the optical modulators in accordance with a particular device requirement. In the example in FIG. 13B, the length $L_1$ of the first optical modulator is markedly greater than the length $L_2$ of the second optical modulator, however the first optical modulator's width $W_1$ is much reduced in comparison to the width $W_2$ of the second optical modulator.

The optical modulators may be arranged in order of active length, the longest being first—i.e. exposed first to the input light. This applies to all of the PAM-N modulators of embodiments of the invention.

Figure 14A:
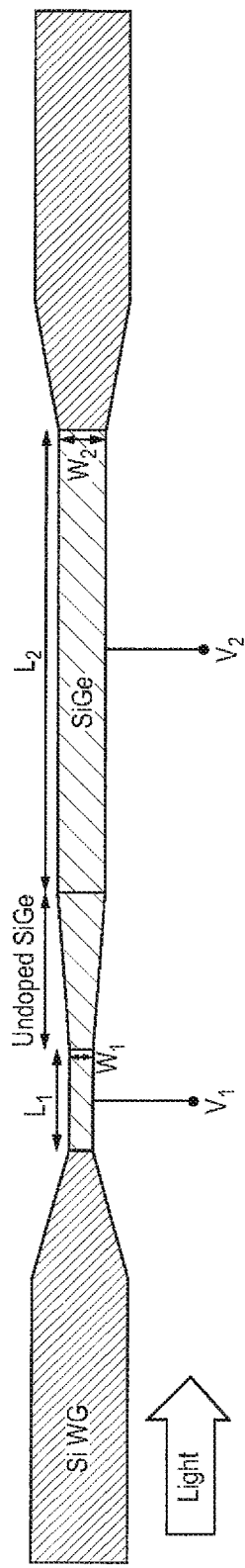
FIGS. 14A and 14B show further variant optoelectronic devices.
Figure 14B:
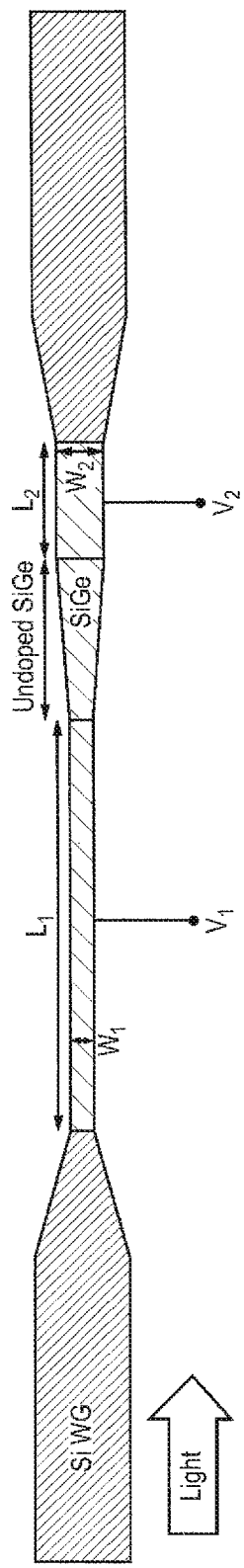

Another feature to note in FIGS. 13A and 13B is that the intermediate waveguides are (i) formed of bulk Si, and (ii) taper from a first width corresponding to the first optical modulator to an output width (the width of the input and output waveguides) and then from the output width to a second width corresponding to the second optical modulator. FIGS. 14A and 14B illustrate similar principles to FIGS. 14A and 14B, however the intermediate waveguides (between the first and second optical modulators) are formed of undoped SiGe and taper directly from the first width to the second width.

The above figures illustrate that the particular parameters of any given optical modulator may vary (or indeed be tuned) whilst still allowing the optoelectronic device comprising said optical modulators to perform PAM-4 modulation.

Figure 15:
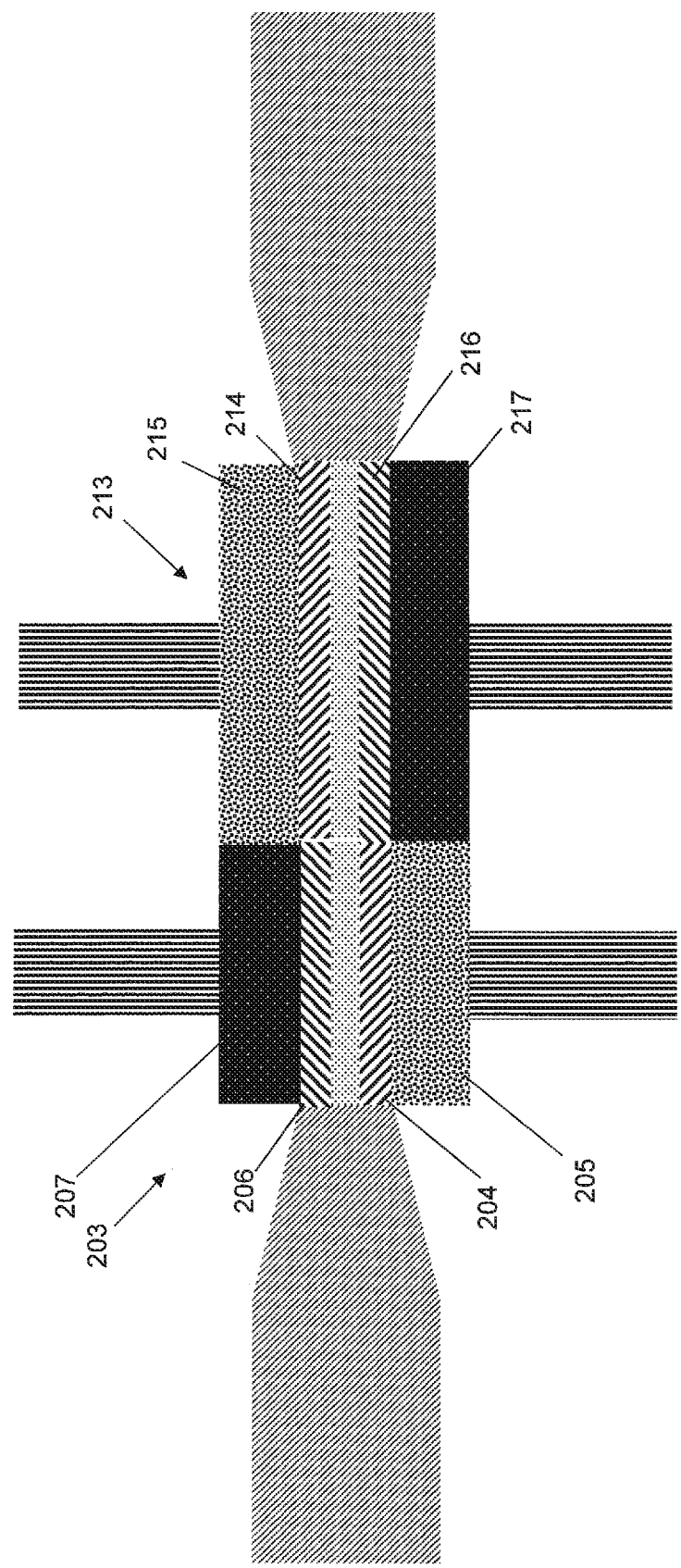
FIG. 15 shows a further variant optoelectronic device.

Another variant configuration is illustrated in FIG. 15. Previously hereto, each optical modulator has been separated by an electrical insulator for example undoped SiGe or bulk Si. However, it is possible to dope the regions of the ridge waveguide such that dopants of opposing polarity are immediately adjacent. For example, as shown in FIG. 15, a heavily doped region 205 of a first species of dopant is immediately adjacent to a heavily doped region 217 of a second species of dopant. The first and second species of dopant are of opposing polarities for example N++ and P++ or P++ and N++ respectively. This is also true for the lightly doped regions 204 and 216.

By doing so, it is possible to reduce the overall length of the optoelectronic device (and so may also reduce the transmission losses associated with the device) whilst retaining the first and second optical modulators which facilitate PAM-4 modulation.

Figure 16:
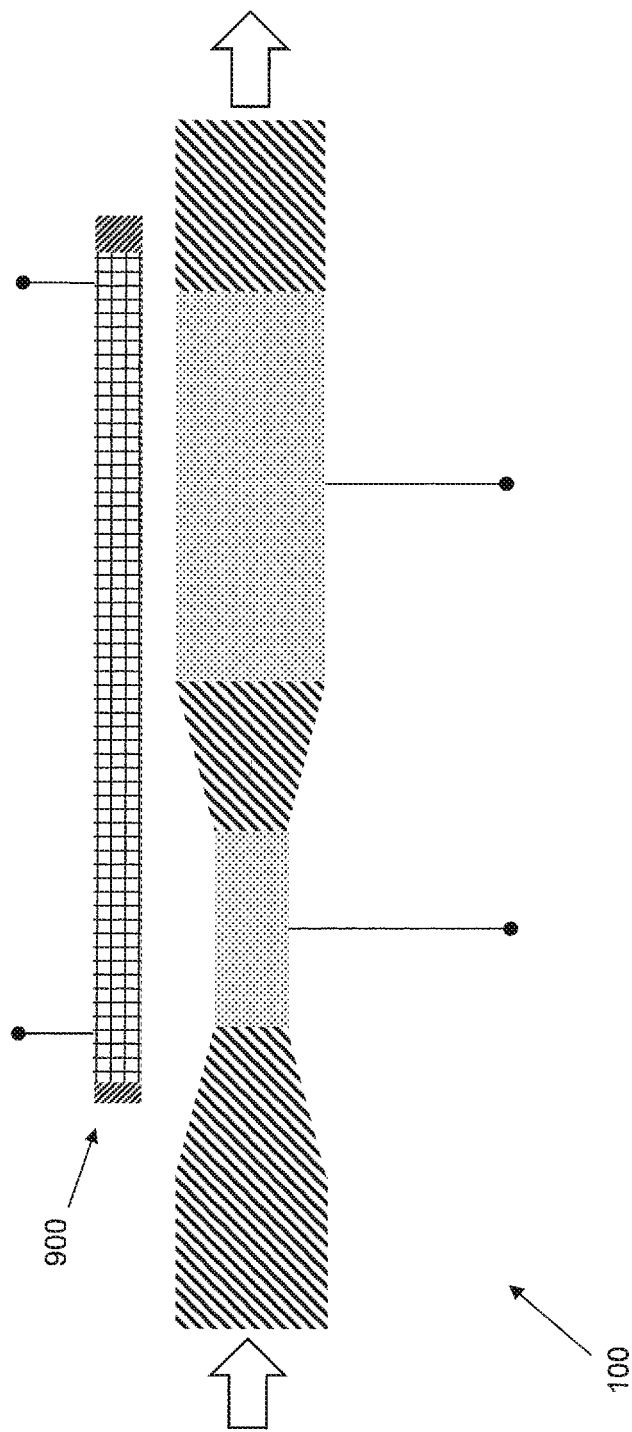
FIG. 16 shows an optoelectronic device according to FIG. 2 including a heater.

FIG. 16 illustrates a variant optoelectronic device 100 which further includes a heater 900 disposed near to the first and second optical modulators. The heater can be used to tune the optical modulators (and therefore the optoelectronic device) with respect to wavelength. The heater can be formed form either doped SiGe, Si, or a metal. The heater is connected to electrodes which allow it to be controlled by the device.

Figure 17A:
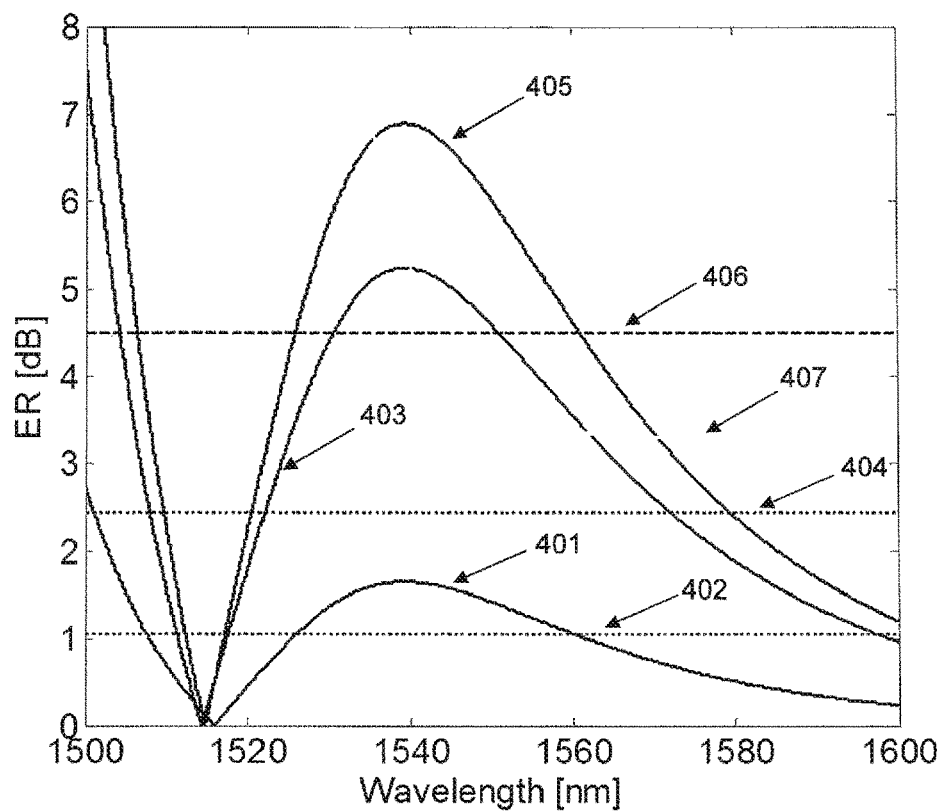
FIGS. 17A and 17B show simulation results for a first optoelectronic device.
Figure 17B:
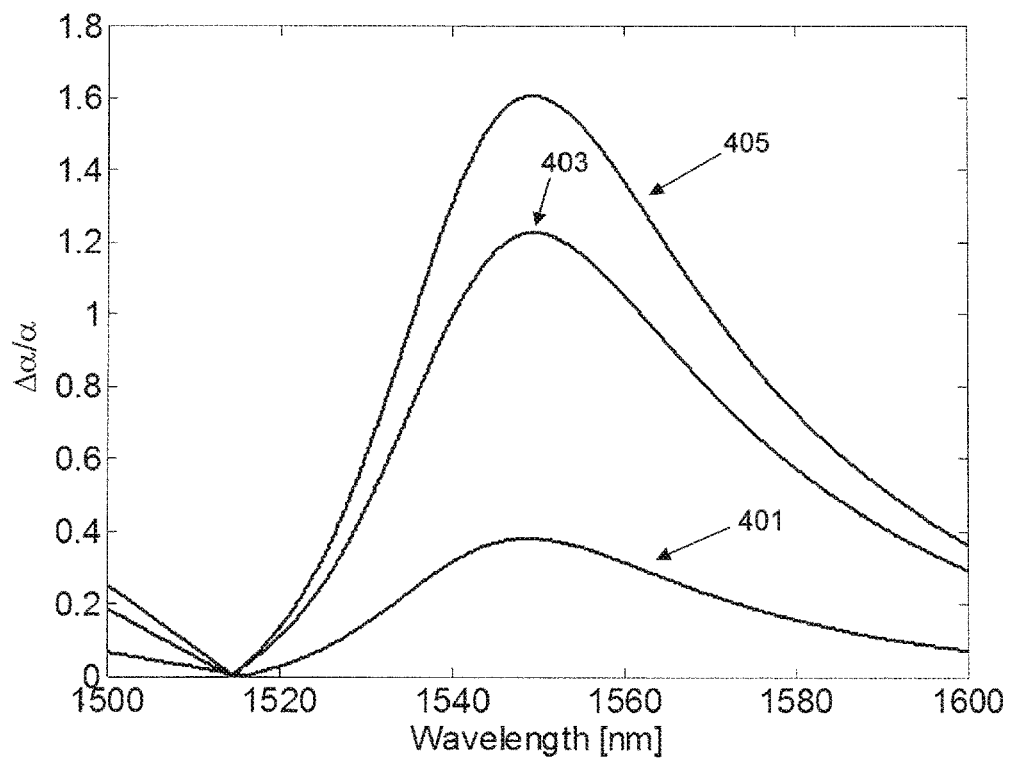

FIGS. 17A and 17B show, respectively, plots of extinction ratio (measured in dB) and $\Delta\alpha/\alpha$ against wavelength for a simulated optoelectronic device. $\alpha$ is the absorption coefficient of the absorbing material (e.g. Ge, SiGe, SiGeSn, or GeSn), $\Delta\alpha$ represents the change in this absorption coefficient as a function of wavelength from when non-zero voltage is applied to the optical modulator to when zero voltage is applied, and $\Delta\alpha/\alpha$ is the normalised change in absorption coefficient as a function of wavelength, and the optoelectronic device has the following parameters: $L_1$=15 μm, $L_2$=40 μm, $W_1$=800 nm, and $W_2$=700 nm. In FIG. 17A, the dotted lines 402, 404, and 406 correspond to minimum target extinction ratios for the PAM-4 levels 1, 2, and 3 respectively. The solid lines 401, 403, and 405 correspond with the extinction ratio of the optoelectronic device when operated in the respective PAM-4 levels: 1, 2, and 3. The solid line 407 indicates the insertion loss in dB associated with the device.

In FIG. 17B, the solid lines 401, 403 and 405 indicate the normalised change in $\alpha$.

Figure 18A:
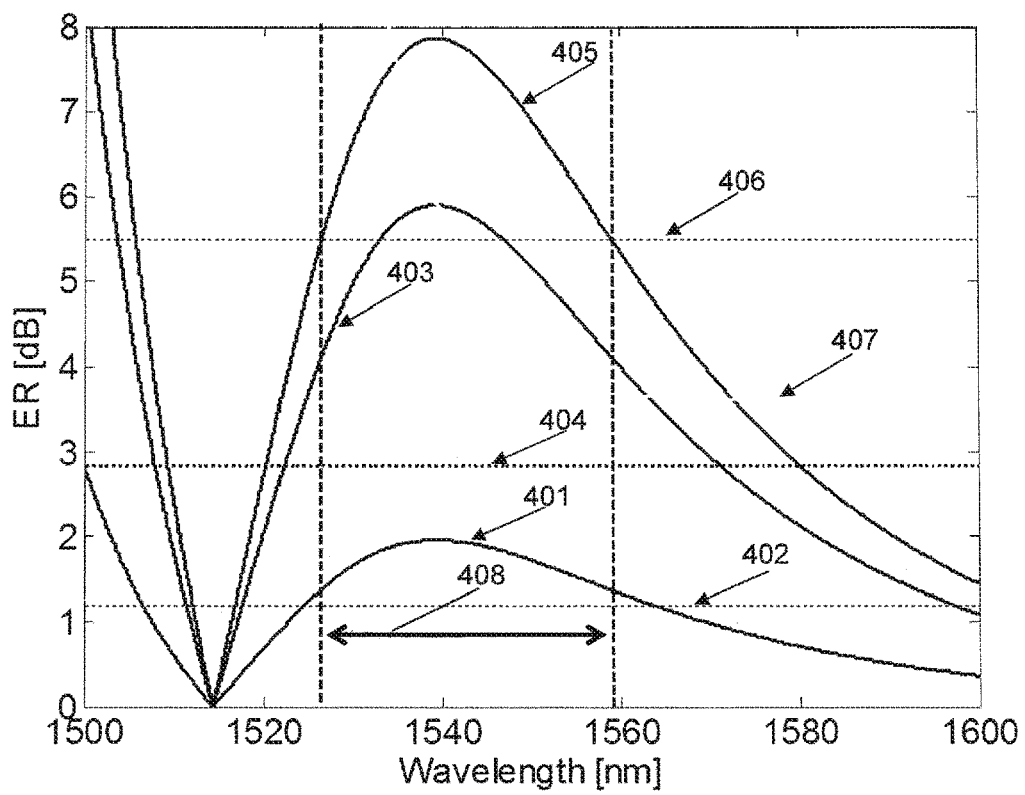
FIGS. 18A and 18B show simulation results for a second optoelectronic device.
Figure 18B:
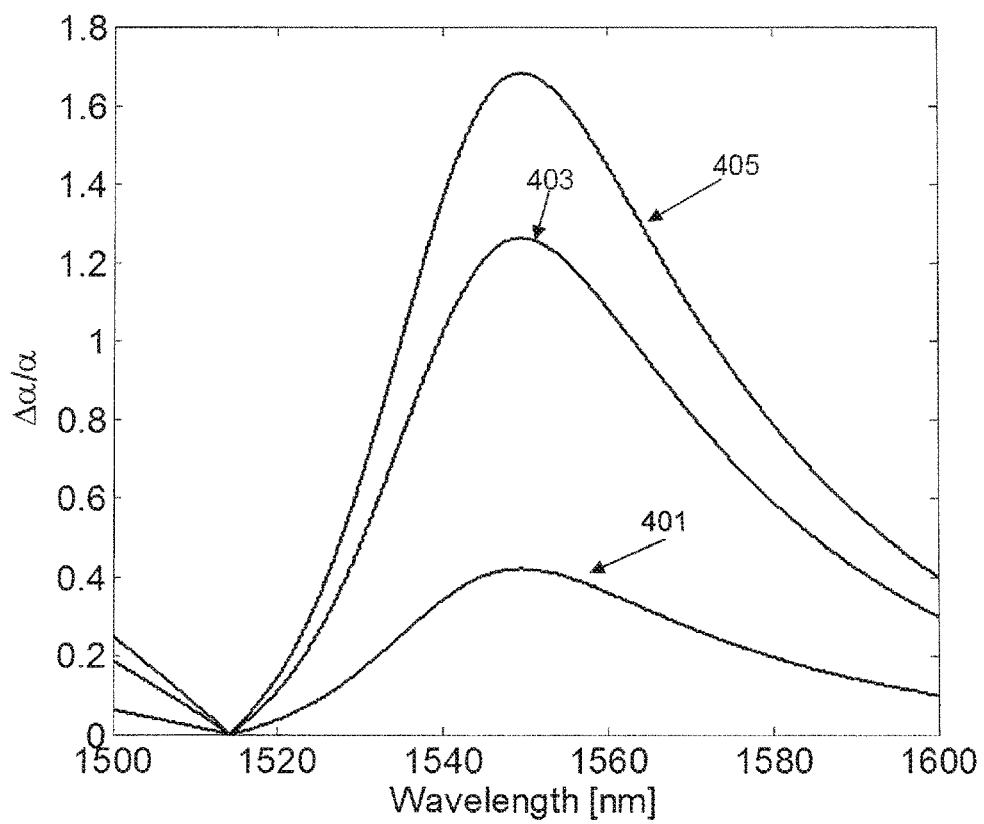

FIGS. 18A and 18B show plots similar to FIGS. 17A and 17B but for a variant optoelectronic device. Here the device had the following parameters: $L_1=15$ μm, $L_2=45$ μm, and $W_1=W_2=700$ nm. Also, indicated in FIG. 18A is the optimum working wavelength bandwidth 408 which is between 1526 nm and 1559 nm.

These plots show that an optoelectronic device formed in accordance with embodiments of the present invention is operable to provide PAM-4 modulated outputs.

Figure 20:
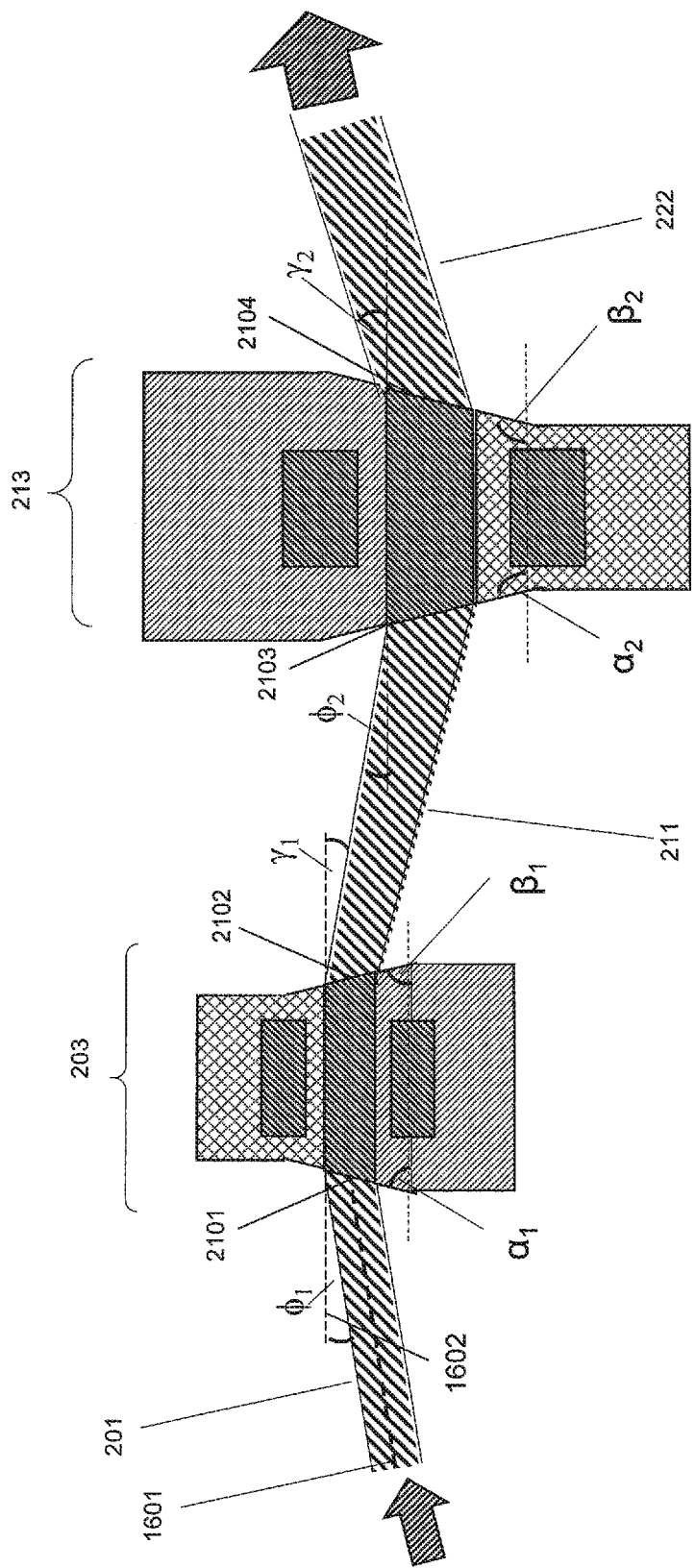
FIG. 20 shows a further variant optoelectronic device.

FIG. 20 shows a variant device which differs from previous devices by having angled interfaces. The devices share a number of features with previous devices, and so like features are indicated by like reference numerals. The input waveguide 104 can be described as guiding light along a central axis 1601. The axis is at an angle $\phi_1$ from a line 1602 which is parallel with a longitudinal direction of the device. Therefore, the input waveguide includes an angled interface 2101. The interface 2101 itself may be at an angle $\alpha 1$ relative to the line 1602 which is not equal to 90°. Similarly, an interface 2104 between the second optical modulator 213 and the output waveguide 222 may be at an angle $\beta 2$ which is not equal to 90°. As with the input waveguide 104, the output waveguide 222 may also guide light along an axis 1603, and this axis 1603 may be at an angle $\beta 2$ to the line 1602.

Figure 19:
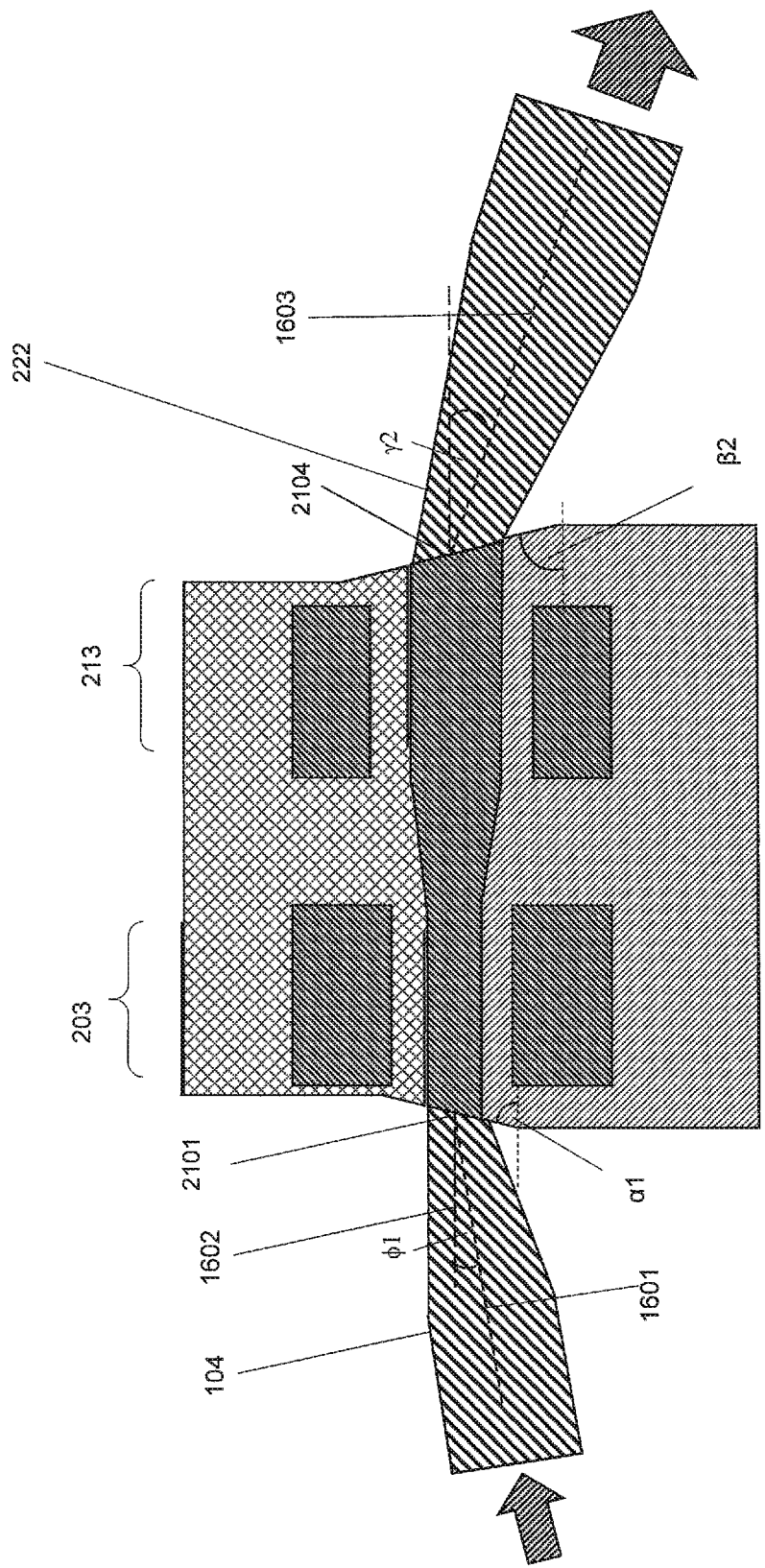
FIG. 19 shows a variant optoelectronic device.
Figure 21:
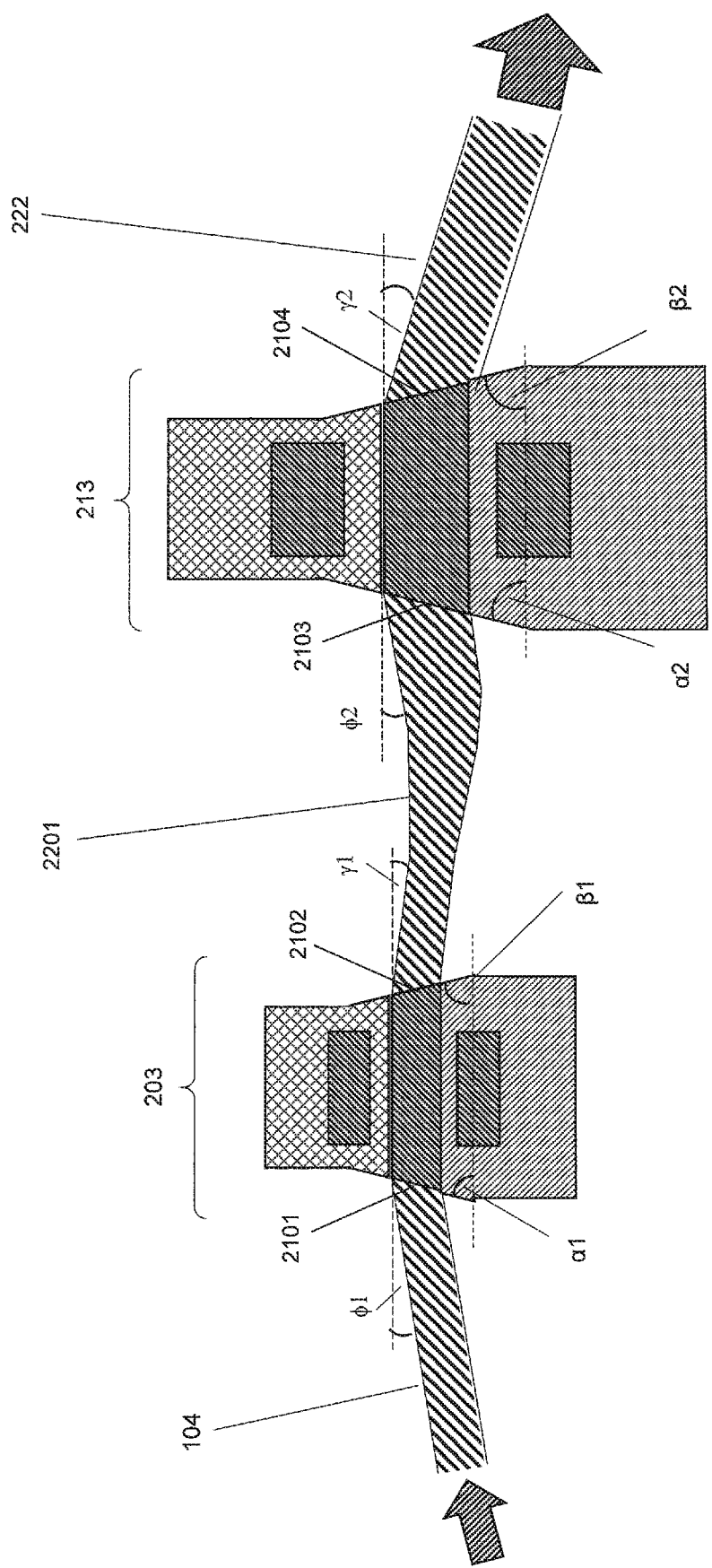
FIG. 21 shows a further variant optoelectronic device.

FIGS. 21 and 22 show variant devices which, like FIGS. 19 and 20, differs from the previous devices by having angled interfaces. The devices share a number of features with the previous devices, and so like features are indicated by like reference numerals. Taking the device shown in FIG. 21 first, the input waveguide 201 can be described as guiding light along a central axis 1601. The axis is at an angle $\phi_1$ from a line 1602 which is parallel with a guiding direction of the first and second optical modulators. Therefore, the input waveguide includes an angled interface 2101.

In the example shown in FIG. 21, there is an intermediate waveguide 211 which is formed of a different material to the first 203 and second 213 optical modulator. Therefore, there is a change in refractive index. In order to reduce back reflections caused by this change in refractive index: the intermediate waveguide 211 may extend at an angle $\gamma_1$ relative to the longitudinal direction 1602. Finally, the output waveguide 222 extends at an angle $\gamma_2$ relative to the longitudinal direction 1602 (which is parallel to the guiding directions in the first and second optical modulators). The angle $\gamma_2$ can be chosen to help mitigate back reflections which may occur as light moves from the second optical modulator 213 into the output waveguide 222.

Generally, the angles obey the following:
- $-14°<\phi_1, \phi_2<14°$
- $-14°<\gamma_1, \gamma_2<14°$ In some cases, $\alpha_1=\beta_1$, $\alpha_2=\beta_2$, $|\gamma_1|=|\gamma_2|$ and $|\phi_1|=|\phi_2|$.

The interface 2101 between the input waveguide 201 and the first optical modulator 203 may be at an angle not equal to 90° relative to the guiding direction of the first optical modulator. As shown in FIG. 21, the interface 2101 may be at an angle $\alpha_1$ which may be less than 90° relative to the guiding direction of the first optical modulator. Similarly, the interface 2102 between the first optical modulator 203 and the intermediate waveguide 211 may be at an angle not equal to 90° relative to the guiding direction of the first optical modulator. As shown in FIG. 21, the interface 2102 may be at an angle $\beta_1$ which may be less than 90° relative to the guiding direction of the first optical modulator.

The intermediate waveguide 211 may project from the first optical modulator 203 at an angle $\gamma_1$ relative to the guiding direction of the first optical modulator. This means the intermediate waveguide 211 may guide light at an angle $\gamma_1$ relative to the guiding direction of the first optical modulator. The guiding direction of the intermediate waveguide 211 may also lie at an angle $\phi_2$ to the guiding direction of the second optical modulator 213.

The interface 2103 between the intermediate waveguide 211 and the second optical modulator 213 may be at an angle which is not equal to 90° relative to the guiding direction of the first optical modulator. As shown in FIG. 21, the interface 2103 may be at an angle $\alpha_2$ relative to the guiding direction of the first optical modulator which may be greater than 90°. Similarly, the interface 2104 between the second optical modulator and the output waveguide 222 may be at an angle not equal to 90° relative to the guiding direction of the first optical modulator. As shown in FIG. 21, the interface 2104 may be at an angle $\beta_2$ relative to the guiding direction of the first optical modulator which may be greater than 90°.

The output waveguide 222 may project from the second optical modulator 213 at an angle $\gamma_2$ relative to the guiding direction of the first optical modulator.

In a typical example of the device shown in FIG. 21: $\alpha_1=80°$; $\beta_1=80°$; $\phi_1=3°$; $\gamma_1=3°$; $\alpha_2=100°=90+(90-\alpha_1)$; $\beta_2=100°=\alpha_2$; $\phi_2=-3°=-\phi_1$; and $\gamma_2=-3°=-\gamma_1$.

In general however:

| | |
|---|---|
| $\alpha_1$ = 89° to 50° | $\alpha_2$ = 91° to 130° |
| $\beta_1$ = 89° to 50° | $\beta_2$ = 91° to 130° |
| $\phi_1$ = 0.3° to 14° | $\phi_2$ = −0.3° to −14° |
| $\gamma_1$ = 0.3° to 14° | $\gamma_2$ = −0.3° to −14° | and, in some embodiments:

| | |
|---|---|
| $\alpha_1$ = 89° to 80° | $\alpha_2$ = 91° to 100° |
| $\beta_1$ = 89° to 80° | $\beta_2$ = 91° to 100° |
| $\phi_1$ = 0.3° to 3° | $\phi_2$ = −0.3° to −3° |
| $\gamma_1$ = 0.3° to 3° | $\gamma_2$ = −0.3° to −3° |

The configuration of the device shown in FIG. 22 is the same as that shown in FIG. 21 insofar as the input waveguide and first optical modulator are concerned. However, the intermediate waveguide 2201 of the device shown in FIG. 22 is not linear as shown previously. Instead, the intermediate waveguide bends as the second optical modulator 213 has been rotated by 180° relative to the second optical modulator shown in FIG. 21. Therefore light guided by the intermediate waveguide 2201 of FIG. 22 follows substantially curved path relative to the intermediate waveguide 211 of FIG. 21.

In a typical example of the device shown in FIG. 22: $\alpha_1=80°$; $\beta_1=80°$; $\phi_1=3°$; $\gamma_1=3°$; $\alpha_2=80°=\alpha_2$; $\beta_2=80°=\alpha_2$; $\phi_2=3°=\phi_1$; and $\gamma_2=3°=\gamma_1$.

In general however:

| | |
|---|---|
| $\alpha_1$ = 89° to 50° | $\alpha_2$ = 89° to 50° |
| $\beta_1$ = 89° to 50° | $\beta_2$ = 89° to 50° |
| $\phi_1$ = 0.3° to 14° | $\phi_2$ = 0.3° to 14° |
| $\gamma_1$ = 0.3° to 14° | $\gamma_2$ = 0.3° to 14° | and, in some embodiments:

| | |
|---|---|
| $\alpha_1$ = 89° to 80° | $\alpha_2$ = 89° to 80° |
| $\beta_1$ = 89° to 80° | $\beta_2$ = 89° to 80° |
| $\phi_1$ = 0.3° to 3° | $\phi_2$ = 0.3° to 3° |
| $\gamma_1$ = 0.3° to 3° | $\gamma_2$ = 0.3° to 3° |

The angled interfaces in the example shown in FIG. 22 may be used instead of those shown in FIG. 21, as the angled interfaces 2102 and 2103 are non-parallel to each other and so may suppress resonator or Fabry-Perot cavity effects within the intermediate waveguide.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

All references referred to above are hereby incorporated by reference.

LIST OF FEATURES

100 Optoelectronic device
101 Input light
102, 201 Input waveguide
103, 202 Tapered region of input waveguide
104, 203 First optical modulator
105, 208 Length—$L_1$—of first optical modulator
106, 209 Waveguide width—$W_1$—of first optical modulator
107, 112 Electrodes
210a, 210b Electrodes
220a, 220b Electrodes
108, 211 Intermediate waveguide
109, 213 Second optical modulator
110, 218 Length—$L_2$—of the second optical modulator
111, 219 Waveguide width—$W_2$—of the second optical modulator
113, 222 Output waveguide
114 Modulated light
115 Example levels of optical modulator
221 Tapered region of output waveguide
204, 214 Lightly doped region (first species)
205, 215 Heavily doped region (first species)
206, 216 Lightly doped region (second species)
207, 217 Heavily doped region (second species)
301 Si slab
302 Heavily doped region (first species)
303 Heavily doped region (second species)
304 SiGe ridge waveguide
305 Lightly doped region (first species)
306 Lightly doped region (second species)
307 Heavily doped region in ridge (first species)
308 Heavily doped region in ridge (second species)
401, 403, 405 First, second, and third optical modulator extinction ratios
402, 404, 406 Minimum target optical modulator extinction ratio
407 Insertion loss
701 First optical modulator
702 Second optical modulator
703 Third optical modulator
900 Heater
1601 Guiding direction of input waveguide
1602 Longitudinal axis of the device/guiding direction of the electro-absorption modulator
2101 Input waveguide-optical modulator interface
2102 Optical modulator-intermediate waveguide interface
2103 Intermediate waveguide-optical modulator interface
2104 Optical modulator-output waveguide interface
2201 Curved intermediate waveguide

What is claimed is:

1. An optoelectronic device operable to provide a PAM-N modulated output, the device comprising:
M optical modulators, M being an integer greater than 1, the M optical modulators being arranged in a cascade, the device being configured to operate in N distinct transmittance states, as a PAM-N modulator,
wherein, in each transmittance state of the N distinct transmittance states, each of the M optical modulators has applied to it a respective control voltage equal to one of:
a first voltage or
a second voltage,
wherein one of the M optical modulators comprises:
a substrate;
a crystalline cladding layer being crystalline through its entire thickness, on top of the substrate; and
an optically active region, above the crystalline cladding layer,
wherein the crystalline cladding layer has a refractive index which is less than a refractive index of the optically active region,
wherein the optoelectronic device is on a silicon on insulator (SOI) wafer comprising the substrate, and
wherein the optically active region and the substrate are part of a single crystal.

2. The device of claim 1, wherein M=N−1.

3. The device of claim 1, wherein:
N=4;
M=3;
the first voltage is between 0 V and 0.2 V; and
the second voltage is between 1.8 V and 2.0 V.

4. The device of claim 1, wherein an optical modulator of the M optical modulators is an electro-absorption modulator.

5. The optoelectronic device of claim 1, further comprising an intermediate waveguide, disposed between a first optical modulator of the M optical modulators and a second optical modulator of the M optical modulators, and operable to convey electromagnetic waves from the first optical modulator to the second optical modulator.

6. The optoelectronic device of claim 5, wherein a first interface between the first optical modulator and the intermediate waveguide is at a first angle relative to a guiding direction of the intermediate waveguide, and a second interface between the second optical modulator and the intermediate waveguide is at an opposite angle to the first angle, wherein the first angle is not a right angle and the opposite angle is not a right angle.

7. The optoelectronic device of claim 1, wherein each of the M optical modulators comprises an optically active region of a ridge waveguide.

8. The optoelectronic device of claim 1, wherein:
the optoelectronic device has a first transmittance in a first transmittance state of the N distinct transmittance states;
the optoelectronic device has a second transmittance in a second transmittance state of the N distinct transmittance states; and
the first transmittance is one half of the second transmittance.

9. The optoelectronic device of claim 1, further comprising a heater, such that the M optical modulators are tuneable with respect to wavelength.

10. The optoelectronic device of claim 1, wherein:
in a first transmittance state of the N distinct transmittance states, all of the M optical modulators have applied to them a control voltage equal to the first voltage; and in a second transmittance state of the N distinct transmittance states, all of the M optical modulators have applied to them a control voltage equal to the second voltage.

11. The optoelectronic device of claim 1, wherein M=2.

12. The optoelectronic device of claim 1, wherein the refractive index of the crystalline cladding layer is at most 0.95 times the refractive index of the optically active region.

13. An optoelectronic device operable to provide a PAM-N modulated output, the device comprising:
M optical modulators, M being an integer greater than 1, the M optical modulators being arranged in a cascade,
the device being configured to operate in N distinct transmittance states, as a PAM-N modulator,
wherein, in each transmittance state of the N distinct transmittance states, each of the M optical modulators has applied to it a respective control voltage equal to one of k different control voltages, wherein k is an integer greater than 1 and less than N, and
wherein one of the M optical modulators comprises:
a substrate;
a crystalline cladding layer being crystalline through its entire thickness, on top of the substrate; and
an optically active region, above the crystalline cladding layer,
wherein the crystalline cladding layer has a refractive index which is less than a refractive index of the optically active region,
wherein the optoelectronic device is on a silicon on insulator (SOI) wafer comprising the substrate, and
wherein the optically active region and the substrate are part of a single crystal.

14. The optoelectronic device of claim 13, wherein the M optical modulators are electro-absorption modulators.

15. The optoelectronic device of claim 13, further comprising an intermediate waveguide, disposed between a first optical modulator of the M optical modulators and a second optical modulator of the M optical modulators and operable to convey electromagnetic waves from the first optical modulator to the second optical modulator.

16. The optoelectronic device of claim 15, wherein a first interface between the first optical modulator and the intermediate waveguide is at a first angle relative to a guiding direction of the intermediate waveguide, and a second interface between the second optical modulator and the intermediate waveguide is at an opposite angle to the first angle, wherein the first angle is not a right angle and the opposite angle is not a right angle.

17. The optoelectronic device of claim 13, wherein each of a first optical modulator of the M optical modulators and a second optical modulator of the M optical modulators comprises an optically active region of a ridge waveguide.

18. The optoelectronic device of claim 13, wherein:
the optoelectronic device has a first transmittance in a first transmittance state of the N distinct transmittance states;
the optoelectronic device has a second transmittance in a second transmittance state of the N distinct transmittance states; and
the first transmittance is one half of the second transmittance.

19. The optoelectronic device of claim 13, further comprising a heater, such that an optical modulator of the M optical modulators is tuneable with respect to wavelength.

20. The optoelectronic device of claim 13, wherein:
in a first transmittance state of the N distinct transmittance states, all of the M optical modulators have applied to them a control voltage equal to a first voltage; and
in a second transmittance state of the N distinct transmittance states, all of the M optical modulators have applied to them a control voltage equal to a second voltage.

21. The optoelectronic device of claim 13, wherein M is greater than or equal to $\text{Log}_2(N)$.

22. The optoelectronic device of claim 13, wherein the refractive index of the crystalline cladding layer is at most 0.95 times the refractive index of the optically active region.

23. An optoelectronic device operable to provide a PAM-N modulated output, the device comprising:
M optical modulators, M being an integer greater than 1, the M optical modulators being arranged in a cascade,
the device being configured to operate in N distinct transmittance states, as a PAM-N modulator,
wherein, in each transmittance state of the N distinct transmittance states, each of the M optical modulators has applied to it a respective control voltage equal to one of k different control voltages, wherein k is an integer greater than 1 and less than N, and
wherein one of the M optical modulators comprises:
a substrate;
a crystalline cladding layer being crystalline through its entire thickness, on top of the substrate; and
an optically active region, above the crystalline cladding layer,
wherein the crystalline cladding layer has a refractive index which is less than a refractive index of the optically active region, and
wherein:
N=4;
M=2; and
k=3.

24. The optoelectronic device of claim 23, wherein:
in a first transmittance state of the 4 distinct transmittance states:
a first optical modulator of the 2 optical modulators has a transmittance that is a maximum transmittance of the first optical modulator; and
a second optical modulator of the 2 optical modulators has a transmittance that is a maximum transmittance of the second optical modulator;
in a second transmittance state of the 4 distinct transmittance states:
the first optical modulator has a first transmittance, the first transmittance being less than the maximum transmittance of the first optical modulator; and
the second optical modulator has the maximum transmittance of the second optical modulator;
in a third transmittance state of the 4 distinct transmittance states:
the first optical modulator has the maximum transmittance of the first optical modulator; and
the second optical modulator has a second transmittance, the second transmittance being less than the first transmittance; and
in a fourth transmittance state of the 4 distinct transmittance states:
the first optical modulator has a third transmittance, the third transmittance being less than the first transmittance; and
the second optical modulator has the second transmittance.

* * * * *